US00RE50766E

(19) United States
(12) Reissued Patent
Kanno

(10) Patent Number: US RE50,766 E
(45) **Date of Reissued Patent: *Jan. 27, 2026**

(54) SEMICONDUCTOR MEMORY DEVICE

(71) Applicant: Kioxia Corporation, Tokyo (JP)

(72) Inventor: Shinichi Kanno, Tokyo (JP)

(73) Assignee: Kioxia Corporation, Tokyo (JP)

( * ) Notice: This patent is subject to a terminal disclaimer.

(21) Appl. No.: 18/899,024

(22) Filed: Sep. 27, 2024

Related U.S. Patent Documents

Reissue of:
(64) Patent No.: 9,048,878
Issued: Jun. 2, 2015
Appl. No.: 14/269,995
Filed: May 5, 2014

U.S. Applications:
(63) Continuation of application No. 17/944,485, filed on Sep. 14, 2022, now Pat. No. Re. 50,197, which is an
(Continued)

(30) Foreign Application Priority Data

Mar. 24, 2010 (JP) ..... 2010-069012

(51) Int. Cl.
*H03M 13/00* (2006.01)
*G06F 11/10* (2006.01)
(Continued)

(52) U.S. Cl.
CPC ..... *G06F 11/1068* (2013.01); *G06F 11/1012* (2013.01); *G06F 11/1072* (2013.01);
(Continued)

(58) Field of Classification Search
CPC ..... G06F 11/1068; G06F 11/1012; G06F 11/1072; G06F 11/1076; G06F 11/10;
(Continued)

(56) References Cited

U.S. PATENT DOCUMENTS 5,995,171 A * 11/1999 Enari ..... H04N 19/98 375/E7.231
5,996,105 A 11/1999 Zook
(Continued)

FOREIGN PATENT DOCUMENTS

JP 2009-211209 9/2009
JP 2009211209 A 9/2009
(Continued)

OTHER PUBLICATIONS

Communication Pursuant to Article 94(3) EPC in counterpart European Application No. 11 155 975.3, dated Mar. 16, 2017 (5 pages).
(Continued)

*Primary Examiner* — Ovidio Escalante
(74) *Attorney, Agent, or Firm* — Finnegan, Henderson, Farabow, Garrett & Dunner, LLP

(57) ABSTRACT

A CRC code is generated from an original data, a BCH code is generated with respect to the original data and the CRC code, and the original data, the CRC code, and the BCH code are recorded in pages selected from different planes of a plurality of memory chips. An RS code is generated from the original data across pages, a CRC code is generated with respect to the RS code, a BCH code is generated with respect to the RS code and the CRC code, and the RS code, the CRC code, the BCH code are recorded in a memory chip different from a memory chip including the original data. When reading data, error correction is performed on the original data by using the BCH code, and then CRC is calculated. If the number of errors is the number of errors that is correctable by erasure correction using the RS code, the original data is corrected by the erasure correction. If the number of errors exceeds an erasure correction capability of the RS code, normal error correction using the RS code is per-
(Continued)

formed, and further error correction using the BCH code is performed.

15 Claims, 15 Drawing Sheets

Related U.S. Application Data application for the reissue of Pat. No. 9,048,878, and a continuation of application No. 15/263,336, filed on Sep. 12, 2016, now Pat. No. Re. 49,253, which is an application for the reissue of Pat. No. 9,048,878, which is a continuation of application No. 13/858,370, filed on Apr. 8, 2013, now Pat. No. 8,751,911, which is a continuation of application No. 12/889,018, filed on Sep. 23, 2010, now Pat. No. 8,418,042.

(51) Int. Cl.

| | |
|---|---|
| ***G11C 16/10*** | (2006.01) |
| ***G11C 29/52*** | (2006.01) |
| ***H03M 13/15*** | (2006.01) |
| ***H03M 13/29*** | (2006.01) |
| *G11C 29/04* | (2006.01) |

(52) U.S. Cl.

CPC ..... *G06F 11/1076* (2013.01); *G11C 16/10* (2013.01); *G11C 29/52* (2013.01); *H03M 13/1515* (2013.01); *H03M 13/29* (2013.01); *H03M 13/2906* (2013.01); *G11C 2029/0411* (2013.01)

(58) Field of Classification Search

CPC ..... G06F 12/16; G11C 16/10; G11C 29/52; G11C 2029/0411; G11C 29/42; G11C 16/06; H03M 13/1515; H03M 13/29; H03M 13/2906

See application file for complete search history.

(56) References Cited

U.S. PATENT DOCUMENTS

| | | | | |
|---|---|---|---|---|
| 6,658,378 | B1 * | 12/2003 | Maeda | H04L 1/0061 704/214 |
| 6,836,869 | B1 | 12/2004 | Wyland | |
| 6,865,699 | B2 * | 3/2005 | Tanaka | H04N 21/4348 370/476 |
| 7,900,117 | B2 | 3/2011 | Kanno | |
| 8,418,042 | B2 | 4/2013 | Kanno | |
| 8,468,417 | B2 | 6/2013 | Asnaashari | |
| 8,751,911 | B2 * | 6/2014 | Kanno | 714/784 |
| 2007/0157064 | A1 | 7/2007 | Falik et al. | |
| 2008/0313493 | A1 | 12/2008 | Roohparvar et al. | |
| 2009/0019321 | A1 | 1/2009 | Radke | |
| 2009/0172335 | A1 | 7/2009 | Kulkarni | |
| 2009/0177944 | A1 | 7/2009 | Kanno | |
| 2009/0183052 | A1 | 7/2009 | Kanno et al. | |
| 2011/0239083 | A1 | 9/2011 | Kanno | |
| 2012/0072795 | A1 | 3/2012 | Yamamoto | |
| 2012/0072811 | A1 | 3/2012 | Fukutomi | |
| 2012/0226957 | A1 | 9/2012 | Fukutomi | |
| 2012/0246387 | A1 | 9/2012 | Kanno | |
| 2013/0080863 | A1 | 3/2013 | Hida | |
| 2014/0189471 | A1 * | 7/2014 | Lee | H04L 1/0045 714/776 |

FOREIGN PATENT DOCUMENTS

| | | | |
|---|---|---|---|
| JP | 2010-541049 | | 12/2010 |
| JP | 2010541049 | A | 12/2010 |
| WO | WO 2007/074441 | A1 | 7/2007 |
| WO | 2009028281 | A1 | 3/2009 |
| WO | WO 2009/028281 | A | 3/2009 |
| WO | WO 2009/041153 | A1 | 4/2009 |
| WO | WO 2009/042554 | A1 | 4/2009 |

OTHER PUBLICATIONS

Extended Search Report Issued May 11, 2011 in the European Patent Application No. 11155975.3.

Office Action issued Nov. 8, 2011, in the Japanese Patent Application No. 2010-069012 (with English-language translation).

Office Action issued Feb. 14, 2012, in the Japanese Patent Application No. 2010-069012 (with English-language translation).

* cited by examiner

SEMICONDUCTOR MEMORY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application] *More than one reissue application has been filed for U.S. Pat. No. 9,048,878 B2. This application is a continuation reissue application of U.S. application Ser. No. 17/944,485, file Sep. 14, 2022, which is a continuation reissue application of U.S. application Ser. No. 15/263,336, filed Sep. 12, 2016 (now Reissue Pat. No. RE 49,253). All of the present application, U.S. application Ser. No. 17/944, 485, and U.S. application Ser. No. 15/263,336 are reissues of U.S. Pat. No. 9,048,878 B2, issued on Jun. 2, 2015, from U.S. application Ser. No. 14/269,995, filed May 5, 2014, which* is a continuation of U.S. application Ser. No. 13/858, 370 filed Apr. 8, 2013, now U.S. Pat. No. 8,751,911, which is a continuation of U.S. application Ser. No. 12/889,018 filed Sep. 23, 2010, now U.S. Pat. No. 8,418,042, and is based upon and claims the benefit of priority from Japanese Patent Application No. 2010-069012, filed on Mar. 24, 2010; the entire contents of each of [which] *the above-identified applications* are incorporated herein by reference.

FIELD

Embodiments described herein relate generally to a semiconductor memory device.

BACKGROUND

A NAND flash memory chip includes a large number of memory cells in the chip thereof, converts data into electric charges, and records the data in the memory cells. The inside of the chip is divided into a plurality of memory blocks. In the memory blocks, there are units called blocks that are units of deleting data, and also there are units called pages that are formed by further dividing the block and are units of reading/writing data.

The NAND flash memory records data in accordance with its electric charge amount. Therefore, as time passes, electric charges discharge, and thus an error occurs in recorded data. To correct the data error due to the discharge of the electric charges over time, generally, an error correction encoding is performed on data to be recorded, and the data and a redundant code generated by the error correction encoding are recorded in a page. An error correction encoding using Reed-Solomon code is described in U.S. Pat. No. 5,996,105.

In recent years, with finer patterning process, in a NAND flash memory chip, the electric charge accumulated to record data is easy to discharge, and when the discharge progresses, the number of random errors increases. Therefore, to save data for a long time, a powerful error correction capability is required. However, when performing a powerful error correction, there is a disadvantage that an amount of error correction code increases.

Meanwhile, the finer patterning process influences not only the memory cells but also peripheral circuits, and hence data failure in a large data block (referred to as burst failure) such as a failure of an entire block due to a failure of an erasure control section in a block cannot be ignored.

Furthermore, as capacities of semiconductor memory devices increase, memory devices including a large number of chips therein are appearing. Therefore, the possibility that a failure as described above is present in a memory device increases dramatically.

DETAILED DESCRIPTION

Figure 1:
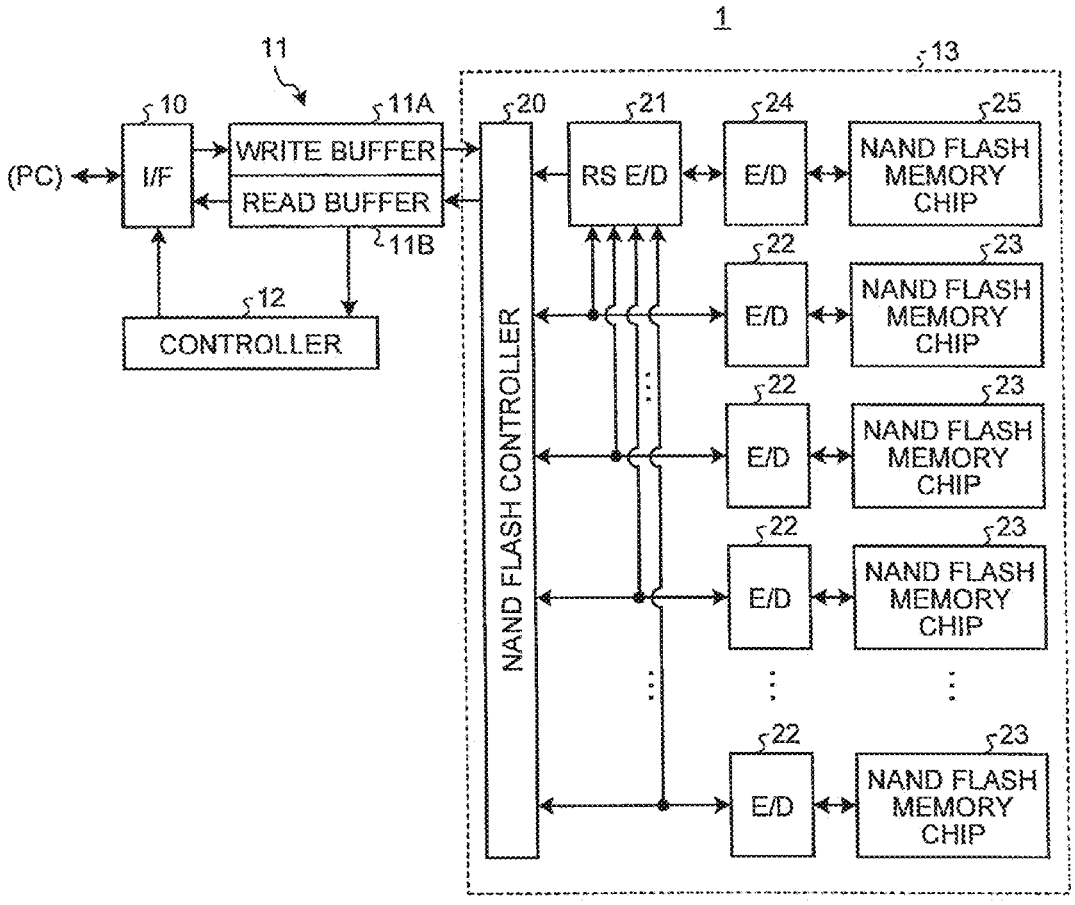
FIG. 1 is a block diagram showing a configuration of a semiconductor memory device applicable to an embodiment.

In general, according to one embodiment, a semiconductor memory device includes a plurality of memory chips configured to store therein data. Each of the plurality of memory chips includes a plurality of second storage areas, and each of the second storage areas includes a plurality of first storage areas each being a unit for storing and reading data. The data includes plural pieces of first data each including a plural pieces of second data to be stored, and plural pieces of third data each including plural pieces of the second data each of which is selected from each of the pieces of the first data so that the plural pieces of the second data included in one piece of the third data are different from those included in different pieces of the third data. The semiconductor memory device includes a first error check code generation unit configured to generate first error check codes on a basis of respective pieces of the first data; a first error correction code generation unit configured to generate first error correction codes which are systematic codes on a basis of respective pieces of the first data and respective first error check codes; a recording unit configured to record the first data, the first error check codes, and the first error correction codes in the first storage areas; and a second error correction code generation unit configured to generate a redundant code that is a Reed-Solomon code for each of the plural pieces of the third data. The data further includes plural pieces of fourth data each having same size as that of the first data and including the redundant codes generated from all the plural pieces of the third data, and the redundant codes including in one piece of the fourth data are different from those included in different pieces of the fourth data. The semiconductor memory device further includes a second error check code generation unit configured to generate second error check codes from respective pieces of the fourth data; and a third error correction code generation unit configured to generate second error correction codes which are systematic codes on a basis of the respective pieces of the fourth data and respective second error check codes. The recording unit further records the fourth data, the second error check codes, and the second error correction codes.

Exemplary embodiments of a semiconductor memory device will be described in detail with reference to the accompanying drawings. In this embodiment, a memory chip storing error correction code for restoring failure of a large data block is provided in a semiconductor memory device in which a plurality of memory chips are mounted. When data fails in a large data block, the data is restored by using the error correction code. The error correction code for restoring failure of a large data block is also used as error correction code for correcting an error in a small data block, and error correction among memory chips and error correction in pages are arbitrarily and repeatedly performed, and hence error correction capability is increased.

FIG. 1 is a block diagram showing a configuration of an example of a semiconductor memory device 1 applicable to an embodiment. In the example of FIG. 1, the semiconductor memory device 1 includes an interface (I/F) 10, a buffer memory 11, a controller 12, and a flash memory section 13.

The interface 10 is an interface between an information processing device such as a personal computer (PC) which is a host of the semiconductor memory device 1. For example, the Serial Advanced Technology Attachment (SATA) standard can be applied to the interface 10. The buffer memory 11 includes a write buffer 11A for record data to be recorded in the flash memory section 13, and a read buffer 11B for read data that is read from the flash memory section 13. The controller 12 includes, for example, a Central Processing Unit (CPU), and controls the interface 10 and the buffer memory 11 to adjust the speed of recording data to the flash memory section 13 and the speed of reading data from the flash memory section 13.

The flash memory section 13 includes a NAND flash controller 20 and a plurality of NAND flash memory chips 23, and further includes a plurality of encoder/decoder (E/D) sections 22 corresponding to the respective NAND flash memory chips 23. The flash memory section 13 further includes a Reed-Solomon code encoder/decoder (RS E/D) section 21, and an E/D section 24 and a NAND flash memory chip 25 corresponding to the RS E/D section 21. The NAND flash memory chips 23 and 25 stores information as electric charges in a large number of memory cells included in the chips.

The NAND flash controller 20 controls recording and reading of data to and from each of the NAND flash memory chips 23 and the NAND flash memory chip 25. The NAND flash controller 20 also controls operations of the E/D sections 22, the E/D section 24, and the RS E/D section 21.

For example, the NAND flash controller 20 includes a memory, and when recording data, if a predetermined amount of data is accumulated in the write buffer 11A, the NAND flash controller 20 reads data, the amount of which corresponds to a unit of recording data recorded in a NAND flash memory chip 23, from the write buffer 11A and stores the data in the memory. The data read from the memory is sent to the E/D section 22 to be subjected error correction encoding, and the data is recorded in the NAND flash memory chip 23 under control of the NAND flash controller 20.

During record processing, the RS E/D section 21 performs error correction encoding on the input data by using the Reed-Solomon code (hereinafter, abbreviated as RS code). During read processing, the RS E/D section 21 decodes RS code of the input data and performs error correction processing on the data. For example, the RS E/D section 21 includes a memory for storing therein data to be encoded or decoded, and performs the error correction encoding processing, the error correction processing, and the like by using data stored in the memory.

During record processing, the E/D sections 22 and the E/D section 24 generate Cyclic Redundancy Check (CRC) code for the input data and perform error correction encoding on the input data and the generated CRC code by using systematic code such as Bose-Chaudhuri-Hocquenghem (BCH) code. During read processing, the E/D sections 22 and the E/D section 24 decode BCH code of the input data to perform error correction, and decode CRC code to obtain the error position. For example, the E/D sections 22 and the E/D section 24 respectively include a memory for storing therein data to be encoded or decoded, and perform the error correction encoding processing, the error correction processing, and the like by using data stored in the memory.

The code used for the error correction encoding performed by the E/D section 22 is not limited to the BCH code, and any systematic code may be used. For example, the RS code, Low-Density Parity-Check (LDPC) code, and the like can be used for the error correction encoding performed by the E/D section 22. Furthermore, it is not limited to the CRC code, and any code may be used as long as the code has sufficient error detection capability such as a check sum.

Figure 2:
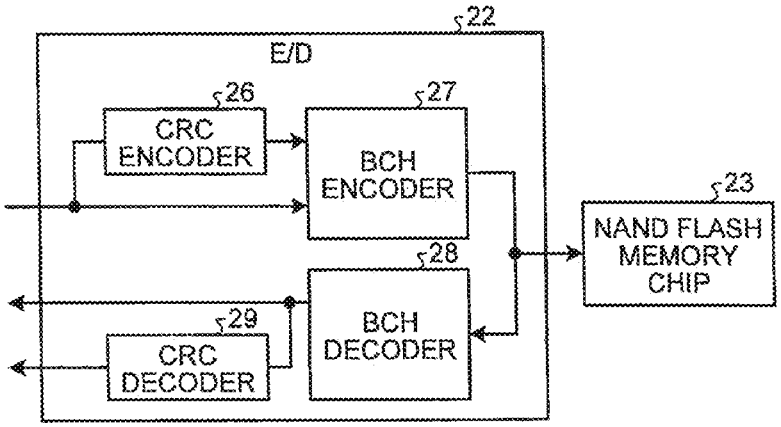
FIG. 2 is a block diagram showing a configuration of an encoder/decoder section.

FIG. 2 shows a configuration of an example of the E/D section 22. The E/D section 22 includes a CRC encoder 26, a BCH encoder 27, a BCH decoder 28, and a CRC decoder 29. Original data that is input into the E/D section 22 to be encoded is sent to the CRC encoder 26 and the BCH encoder 27.

The CRC encoder 26 (a first error check code generator) calculates CRC of the received original data, and generates CRC code that is an error check code from the calculation result. The CRC code is sent to the BCH encoder 27. The BCH encoder 27 (a first error correction code generator) generates BCH code that is an error correction code for the original data and the CRC code provided from the CRC encoder 26, and performs error correction encoding on the original data and the CRC code. The BCH code, the original data, and the CRC code are output from the E/D section 22.

When the data that is error-correction-encoded by using the BCH code as described above is input into the E/D section 22 and sent to the BCH decoder 28. The BCH decoder 28 (a first error correction section) decodes the BCH code of the input data, and corrects an error that is correctable by code correction capability of the BCH code. The CRC decoder 29 (a first error check section) decodes the CRC code included in an output from the BCH decoder 28 to perform an error check. The output from the BCH decoder 28 and a result of the error check are output from the E/D section 22.

The E/D section 24 can be also realized by the same configuration as that of the E/D section 22 shown in FIG. 2, and thus the detailed description will be omitted. Here, as illustrated on the right side (redundant section side) of FIG. 5 described below, the CRC encoder 26 and the BCH encoder 27 in the E/D section 22 correspond to the CRC encoder 26' (a second error check code generator) and the BCH encoder 27' (a third error correction code generator) in the E/D section 24, respectively. Furthermore, as illustrated on the redundant section side of FIG. 9 described below, the BCH decoder 28 and the CRC decoder 29 in the E/D section 22 correspond to the BCH decoder 28' (a third error correction section) and the CRC decoder 29' (a second error check section) in the E/D section 24, respectively.

In the configuration as described above, the original data read from the write buffer 11A is sent to the NAND flash controller 20 and further sent to each of the E/D sections 22 under the control of the NAND flash controller 20.

In each of the E/D sections 22, the CRC encoder 26 generates a CRC code for the received original data, and the BCH encoder 27 generates a BCH code for the original data and the CRC code to perform error correction encoding on the original data and the CRC code. A data set including the BCH code, the CRC code, and the original data output from each of the E/D sections 22 is recorded in each corresponding NAND flash memory chip 23.

The original data is also sent to the RS E/D section 21. The RS E/D section 21 generates a redundant code (hereinafter simply referred to as RS code) of the RS code for the received original data to perform error correction encoding on the original data. The RS code generated by the RS E/D section 21 is input into the E/D section 24. In the E/D sections 24, the CRC encoder 26' generates a CRC code for the received RS code, and the BCH encoder 27' generates a BCH code for the RS code and the CRC code to perform error correction encoding on the RS code and the CRC code. A data set including the BCH code, the CRC code, and the RS code output from the E/D sections 24 is recorded in the NAND flash memory chip 25.

The operation for reading data from the NAND flash memory chip 23 is schematically described as follows: Data read from each NAND flash memory chip 23 is sent to each corresponding E/D section 22. In the E/D section 22, the BCH decoder 28 decodes the BCH code of the received data to perform error correction on the original data and the CRC code, and the CRC decoder 29 decodes the CRC code included in the output from the BCH decoder 28 to perform an error check. The original data on which the error correction processing is performed and the result of the error check are sent to the NAND flash controller 20 and the RS E/D section 21.

At the same time, data read from the NAND flash memory chip 25 is sent to the E/D section 24. In the E/D sections 24, the BCH decoder 28' decodes the BCH code of the received data to perform error correction on the RS code and the CRC code, and the CRC decoder 29' decodes the CRC code included in the output of the BCH decoder 28' to perform an error check. The RS code on which the error correction processing is performed and the result of the error check are sent to the RS E/D section 21.

If the number of errors that is the sum of the number of errors obtained as a result of the error check performed by the E/D section 22 and the number of errors obtained as a result of the error check performed by the E/D section 24 is not 0, the RS code is decoded by the RS E/D section 21, and error correction processing using the RS code is performed on the original data on which error correction processing using the BCH code output from the E/D section 22 is performed and the RS code itself. At this time, depending on a condition related to the number of errors described in detail below, whether a normal error correction is performed or an erasure correction is performed is selected. When it is selected that the erasure correction is performed, the original data in which errors are corrected is sent to the NAND flash controller 20 as output data.

In contrast, when it is selected that the normal error correction is performed, each of the E/D sections 22 further performs error correction processing using the BCH code on the original data on which error correction processing using the RS code is performed by the RS E/D section 21. If all errors are corrected by this error correction processing, the original data in which errors are corrected is sent to the NAND flash controller 20 as output data. If not all errors are corrected, the error correction processing in the RS E/D section 21 and the E/D sections 22 is performed again.

The NAND flash controller 20 ends a series of error correction processing described in detail below, and finally writes the data sent from the E/D sections 22 and the RS E/D section 21 to the read buffer 11B.

Figure 3:
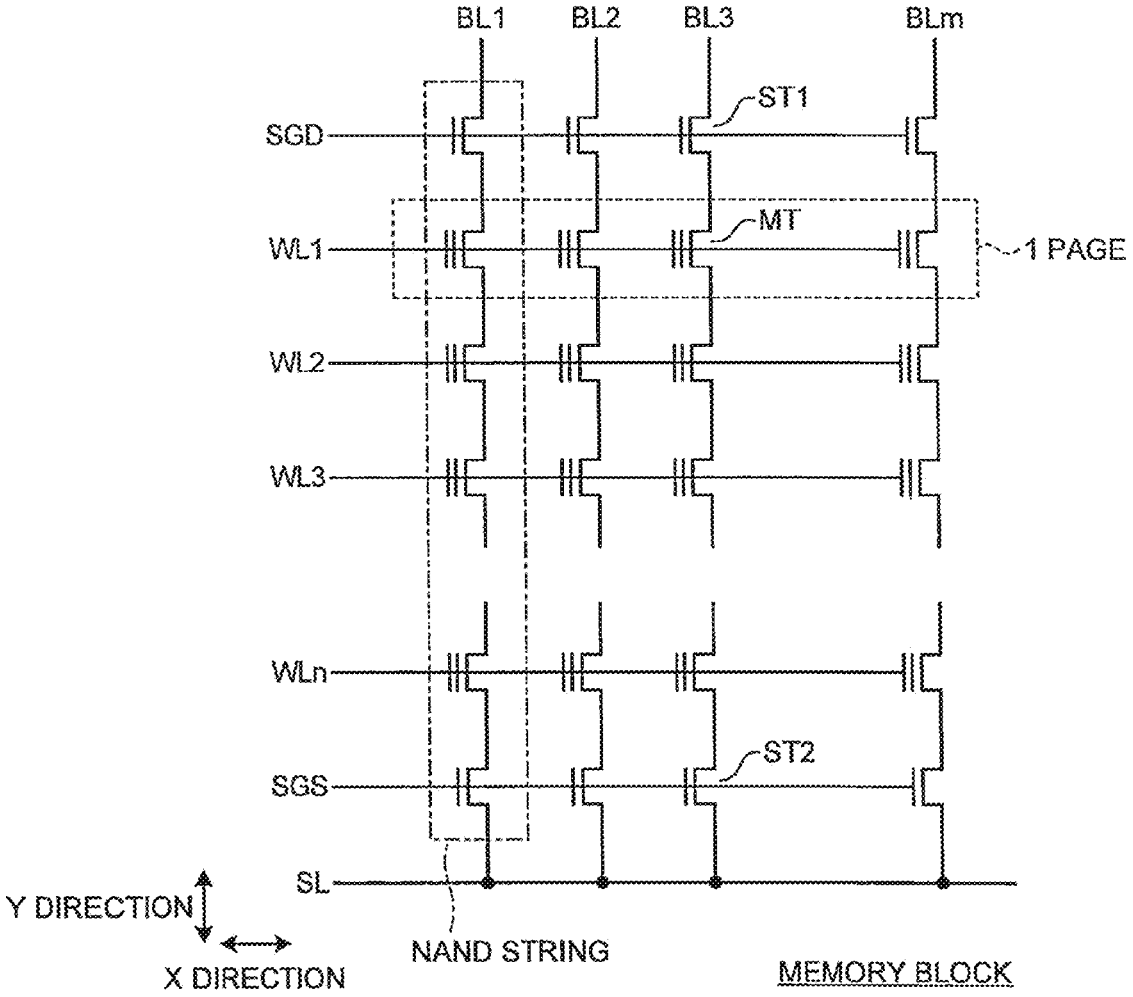
FIG. 3 is an equivalent circuit diagram showing a configuration example of a memory block BLK.

Next, a configuration of the NAND flash memory chip will be schematically described. The NAND flash memory chip is constituted by a plurality of memory blocks BLK that are units for deleting data. A configuration of the memory block BLK will be described with reference to FIG. 3. FIG. 3 is an equivalent circuit diagram showing a configuration example of one of the memory blocks BLK.

The memory block BLK includes m (m is an integer of 1 or more) NAND strings arranged along an X direction. Each NAND string includes selection transistors ST1 and ST2, and n (n is an integer of 1 or more) memory cell transistors MT. In the selection transistor ST1 included in each of m NAND strings, the drain is connected to one of bit lines BL1 to BLm, and the gate is commonly connected to a selection gate line SGD. In the selection transistor ST2, the source is commonly connected to a source line SL, and the gate is commonly connected to a selection gate line SGS.

Each of the memory cell transistors MT is a metal oxide semiconductor field effect transistor (MOSFET) having a stacked gate structure formed on a semiconductor substrate with a gate insulating film interposed therebetween. The stacked gate structure includes a charge accumulation layer (floating gate electrode) formed on the gate insulating film and a control gate electrode formed on the charge accumulation layer with an inter-gate insulating film interposed therebetween. In each NAND string, n memory cell transistors MT are arranged so that the respective current paths are series-connected between the source of the selection transistor ST1 and the drain of the selection transistor ST2. In other words, in the n memory cell transistors MT, memory cell transistors MT are series-connected in a Y direction so that the source/drain regions are shared between adjacent transistors.

In order from the memory cell transistor MT positioned nearest the drain side, the control gate electrodes of the memory cell transistors MT are sequentially connected to word lines WL1 to WLn. Therefore, the drain of the memory cell transistor MT connected to the word line WL1 is connected to the source of the selection transistor ST1, and the source of the memory cell transistor MT connected to the word line WLn is connected to the drain of the selection transistor ST2.

The word lines WL1 to WLn commonly connect control gate electrodes of the memory cell transistors MT of different NAND strings in the memory block BLK. In other words, the control gate electrodes of the memory cell transistors MT on the same row in the memory block BLK are connected to the same word line WL. A plurality of memory cells connected to the same word line WL are handled as one page and data is written and read per page. In other words, the page is a unit block (a first storage area) that is a unit for recording and reading in the NAND flash memory chip. A plurality of pages can be collectively managed (a second storage area).

The bit lines BL1 to BLn respectively connect to the drains of the selection transistors ST1 in the memory block BLK. In other words, a NAND string on the same column in a plurality of the memory blocks BLK is connected to the same bit line BL.

A voltage of the memory cell transistor MT changes in accordance with an amount of charge accumulated in the floating gate electrode, and the memory cell transistor MT stores information in accordance with the voltage changing. The memory cell transistor MT may be configured to store 1 bit information, or may be configured to store multi-bit information. The NAND flash memory chips 23 and 25 according to this embodiment are configured to be able to store 2-bit information.

A control circuit including a sense amp and a voltage generation circuit that are not shown in FIG. 3 in the NAND flash memory chip has a configuration capable of writing data sent to the NAND flash memory chip to the memory cell transistor MT and outputting data stored in the memory cell transistor MT to the outside of the NAND flash memory chip.

As described above, in the NAND flash memory chip, one memory block BLK includes a plurality of pages. A plurality of memory blocks BLK constitute a plane. Different planes in one NAND flash memory chip can be accessed in parallel. On the other hand, different blocks in one plane cannot be accessed in parallel.

Multi-value storage function of the NAND flash memory chip will be schematically described with reference to FIG. 4. As described above, in the NAND flash memory chip, information is stored by using a voltage changing in accordance with an amount of charge accumulated in the floating gate electrode. Therefore, by setting a plurality of signal points with respect to a change of voltage or an amount of charge, multi-value information can be stored.

Figure 4:
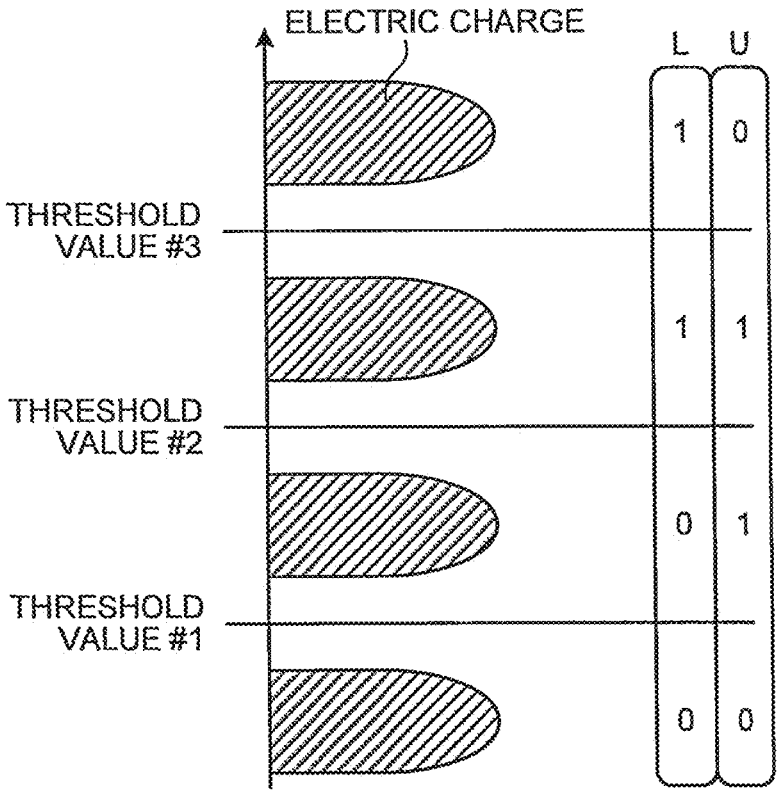
FIG. 4 is a diagram for explaining multi-value storage function of a NAND flash memory chip.

In this embodiment, as illustrated on the left side of FIG. 4, by setting 3 signal points with respect to the amount of charge accumulated in the floating gate electrode, a state of the memory cell transistor MT can be sorted into 4 states corresponding to the accumulated amount of charge, so that 2-bit information can be stored. In the example of FIG. 4, the signal points are a threshold value #1, a threshold value #2, and a threshold value #3.

At this time, a code is assigned to each state so that a Hamming distance between the codes whose states are adjacent to each other is 1. In the example of FIG. 4, the upper bit of the two bits is defined as "U: Upper" and the lower bit is defined as "L: Lower", and when the threshold value #1<the threshold value #2<the threshold value #3, "0" is assigned to the upper bit and "1" is assigned to the lower bit with respect to a state in which the amount of charge is greater than the threshold value #3. With respect to a state in which the amount of charge is smaller than the threshold value #3 and greater than the threshold value #2, "1" is assigned to the upper bit and "1" is assigned to the lower bit. With respect to a state in which the amount of charge is smaller than the threshold value #2 and greater than the threshold value #1, "1" is assigned to the upper bit and "0" is assigned to the lower bit. With respect to a state in which the amount of charge is smaller than the threshold value #1, "0" is assigned to the upper bit and "0" is assigned to the lower bit.

The upper bit and the lower bit can be read from the word lines WL. In the actual usage of the NAND flash memory chip that can be applied to the embodiment, the word lines WL are allocated to word lines WL from which only the upper bits are read and word lines WL from which only the lower bits are read, and used. In other words, pages are classified into pages constituted by only upper bits (referred to as Upper bit pages) and pages constituted by only lower bits (referred to as Lower bit pages).

<Encoding Processing>

Figure 5:
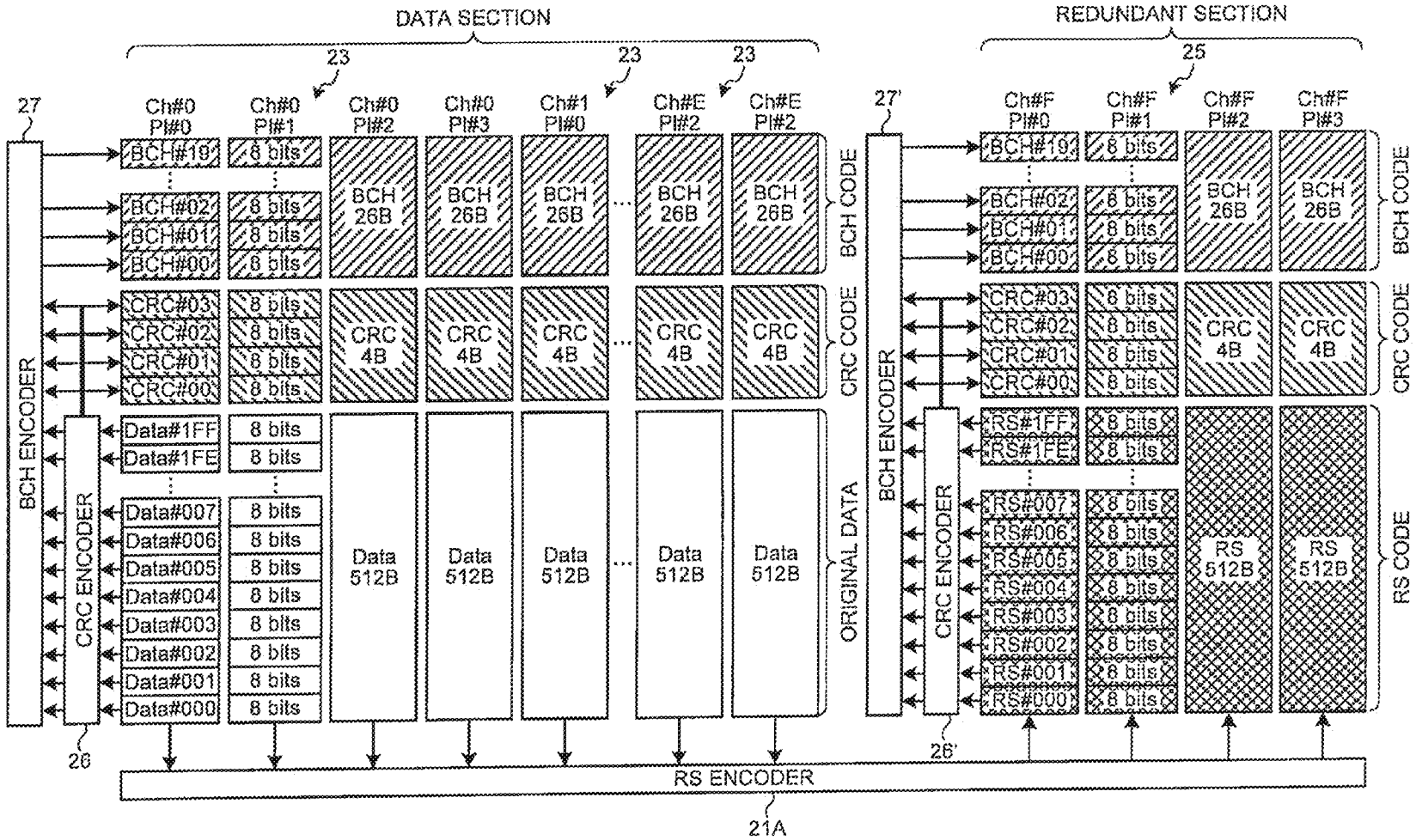
FIG. 5 is a block diagram showing a recording format according to the embodiment.

Next, encoding processing of the error correction code according to the embodiment will be described in more detail with reference to FIGS. 5 and 6. FIG. 5 shows an example of a recording format according to the embodiment. In FIG. 5, the same reference symbols are given to the same portions as those in FIGS. 1 and 2 described above, and detailed description will be omitted. An RS encoder 21A (a second error correction code generator) indicates a portion that realizes the encoding function of the RS E/D section 21 in FIG. 1.

In FIG. 5, NAND flash memory chips and planes are represented as chips Ch#n and planes Pl#n (each n is a hexadecimal number), in which data block sets including data blocks Data (or alternatively data blocks RS), data blocks CRC, and data blocks BCH are recorded.

In this example, the flash memory section 13 has a total of 16 NAND flash memory chips (chips Ch#0 to Ch#F) respectively corresponding to the NAND flash memory chips 23 and 25. Among them, the chips Ch#0 to Ch#E represented as a data section correspond to the NAND flash memory chips 23 in FIG. 1. The chip Ch#F represented as a redundant section corresponds to the NAND flash memory chip 25 in FIG. 1. Each of the chips Ch#0 to Ch#F is constituted by 4 planes Pl#0 to Pl#3. The data block set described above is recorded on one page.

Figure 6:
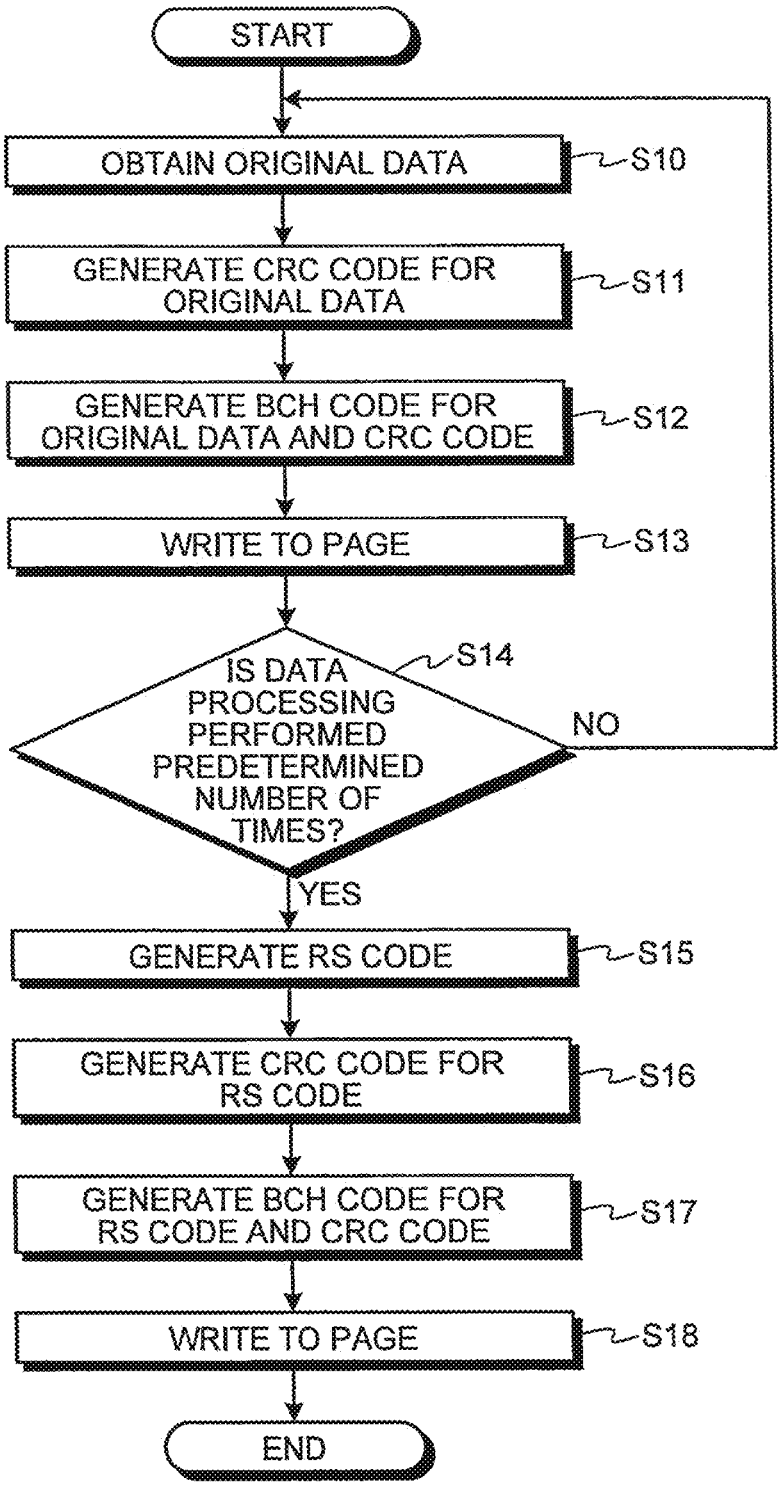
FIG. 6 is a flowchart showing error correction encoding processing according to the embodiment.

FIG. 6 is a flowchart of an example showing the error correction encoding processing according to the embodiment. The error correction encoding processing according to the embodiment will be described with reference to the flowchart of FIG. 6 and the above described FIG. 5. In step S10, each E/D section 22 obtains a predetermined amount (512 bytes in this example) of original data from the memory of the NAND flash controller 20. At this time, the original data is obtained also by the RS E/D section 21 and stored in a memory not shown in the figures.

In the next step S11, the CRC encoder 26 in the E/D sections 22 calculates CRC for every 8 bits (second data) of the original data, and generates a CRC code (a first error check code). In this example, a CRC code of 4 bytes is generated from the original data of 512 bytes. The CRC code is sent to the BCH encoder 27. In the next step S12, the BCH encoder 27 generates a BCH code for every 8 bits of the original data, and also generates a BCH code for every 8 bits of the CRC code generated in step S11. In this example, a BCH code of 26 bytes (a first error correction code) is generated from the original data of 512 bytes and the CRC code of 4 bytes.

In the next step S13, the original data, the CRC code generated from the original data, and the BCH code generated from the original data and the CRC code are recorded on one page of a plane in the NAND flash memory chip 23. For example, in first recording, the original data, the CRC code, and the BCH code are recorded on one page in the plane Pl#0 of the NAND flash memory chip Ch#0 as a data block Data (first data), a data block CRC, and a data block BCH respectively.

In the next step S14, it is determined whether or not data processing is performed a predetermined number of times. For example, it is determined whether or not the data block Data, the data block CRC, and the data block BCH have been recorded page by page in each of the planes Pl#0 to Pl#3 of the NAND flash memory chips Ch#0 to Ch#E of the data section. If it is determined that the data processing has not been performed the predetermined number of times, the process returns to step S10, and the next predetermined amount of original data is obtained.

When the process returns to step S10, the data block Data, the data block CRC, and the data block BCH that are generated on the basis of the next predetermined amount of original data are recorded on a page in a plane different from planes in which the data block Data, the data block CRC, and the data block BCH have been recorded before. For example, this is realized by sequentially recording the data block set constituted by the data block Data, the data block CRC, and the data block BCH on one page of each of the planes Pl#0 to Pl#3 through the NAND flash memory chips Ch#0 to Ch#E.

On the other hand, if it is determined that the data processing is performed the predetermined number of times, the process proceeds to step S15. In step S15, an RS code for the original data is generated by the RS encoder 21A. In the processing of step S10 to step S13 described above, the RS encoder 21A obtains the same data as the data block Data recorded page by page in all the planes Pl#0 to Pl#3 of the NAND flash memory chips Ch#0 to Ch#E. The RS encoder 21A extracts data (third data) 8 bits by 8 bits (1 symbol), the position of which corresponds to each other in the data block Data, across the data block Data from the obtained data, and generates the RS code (a second error correction code).

In the next step S16, the CRC encoder 26' in the E/D section 24 calculates CRC for every 8 bits of the RS code generated in step S15 described above, and generates a CRC code. The CRC code is sent to the BCH encoder 27' in the E/D section 24. In the next step S17, the BCH encoder 27' generates a BCH code for every 8 bits of the RS code, and also generates a BCH code for every 1 byte of the CRC code generated in step S16.

In the next step S18, the RS code, the CRC code generated from the RS code, and the BCH code generated from the RS code and the CRC code are recorded on one page of a plane in the NAND flash memory chip 25 (NAND flash memory chip Ch#F). At this time, the RS code, the CRC code generated from the RS code, and the BCH code generated from the RS code and the CRC code are recorded on one page of each of the planes Pl#0 to Pl#3 in the NAND flash memory chip Ch#F as the data block RS (fourth data), the data block CRC, and the data block BCH, respectively.

As described above, the RS code is generated in a direction crossing the data block Data, so that the RS code is formed in the same size as the data block Data in the page direction and the RS code is formed as a data block having the size across a plurality of pages in the direction crossing the data block Data. Therefore, data is selected from the block so that the sequence of data in the page direction does not change, a block having the same size as the data block Data is created as a data block RS, and the data block RS is recorded in the NAND flash memory chip 25.

In a NAND flash memory chip, the probability that an error occurs when reading recorded data may be different for each page. In this case, for example, it is preferable that the data block RS is recorded in a page having a low expected value of error. For example, when the average value of expected values of error in each page in the NAND flash memory chip 25 is obtained, the data block RS is recorded in a page having an expected value of error smaller than the average value, in other words, the data block RS is recorded in a page having a low probability of error occurrence.

Here, an occurrence of an error due to a charge accumulated state in the memory cell transistor MT will be described. As described using FIG. 4, in the memory cell transistor MT, threshold value determination is performed on the amount of charge accumulated in the floating gate electrode, and the upper bit and the lower bit are determined. More specifically, when the amount of charge is between the threshold value #1 and the threshold value #3, the upper bit is "1", otherwise the upper bit is "0". The lower bit is "1" when the amount of charge is greater than the threshold value #2 and the lower bit is "0" when the amount of charge is smaller than the threshold value #2. Therefore, if the amount of charge during reading is different from the amount of charge during recording, a bit error occurs.

Figure 7A:
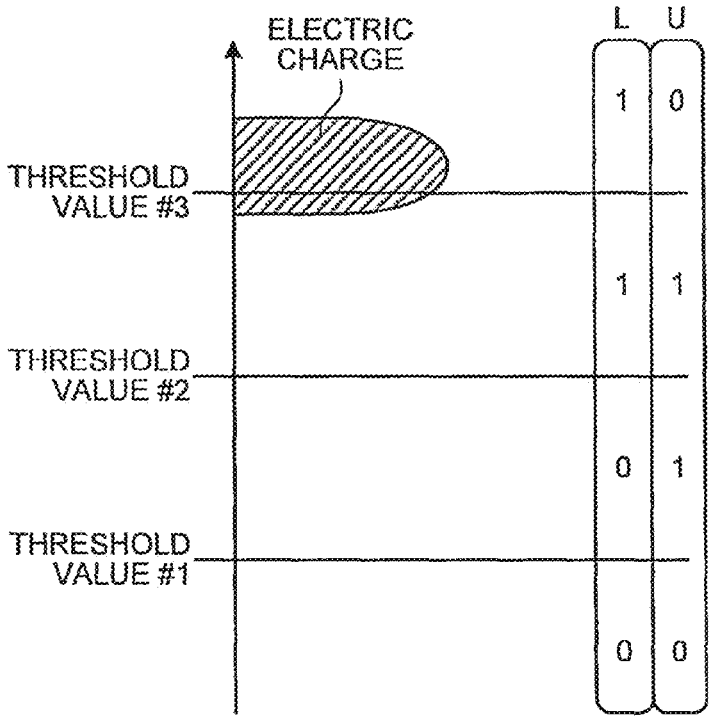
FIG. 7A is a diagram for explaining an occurrence of an error associated with a charge accumulated state.

The occurrence of an error associated with a charge accumulated state will be described in more detail with reference to FIGS. 7A and 7B. FIG. 7A shows an example of a case in which the amount of charge during reading decreases compared with the amount of charge during recording. During recording, to record a code word "10", an amount of charge greater than the threshold value #3 is accumulated in the memory cell. If the amount of charge in a part of the memory cell decreases to a value smaller than the threshold value #3 by the time of reading, an error occurs in the upper bit. In the code word, the front side value represents the lower bit, and the back side value represents the upper bit.

Figure 7B:
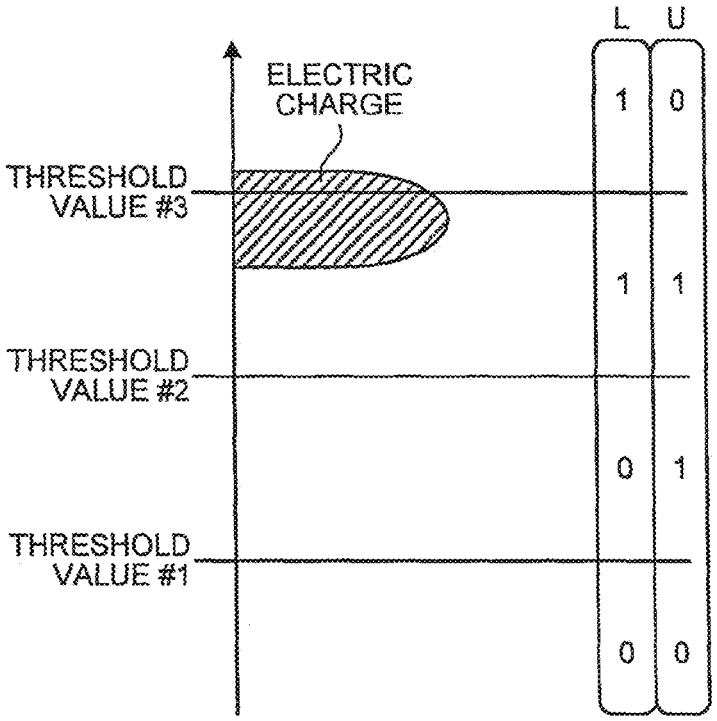
FIG. 7B is a diagram for explaining an occurrence of an error associated with a charge accumulated state.

FIG. 7B shows an example of a case in which the amount of charge during reading increases compared with the amount of charge during recording. During recording, to record a code word "11", an amount of charge greater than the threshold value #2 and smaller than the threshold value #3 is accumulated in the memory cell. If the amount of charge in a part of the memory cell exceeds the threshold value #3 by the time of reading, an error occurs in the upper bit.

There are 2 cases in which an error occurs because the amount of charge varies between the time of recording and the time of reading for each threshold value, so that there are a total of 6 cases as follows:

(1) A code word "10" is recorded, the amount of charge decreases to a value smaller than the threshold value #3 by the time of reading, and an error occurs in the upper bit.

(2) A code word "11" is recorded, the amount of charge increases to a value greater than the threshold value #3 by the time of reading, and an error occurs in the upper bit.

(3) A code word "11" is recorded, the amount of charge decreases to a value smaller than the threshold value #2 by the time of reading, and an error occurs in the lower bit.

(4) A code word "01" is recorded, the amount of charge increases to a value greater than the threshold value #2 by the time of reading, and an error occurs in the lower bit.

(5) A code word "01" is recorded, the amount of charge decreases to a value smaller than the threshold value #1 by the time of reading, and an error occurs in the upper bit.

(6) A code word "00" is recorded, the amount of charge increases to a value greater than the threshold value #1 by the time of reading, and an error occurs in the upper bit.

As described above, there are 4 cases in which an error occurs in the upper bit, whereas there are 2 cases in which an error occurs in the lower bit. This is because there are 2 chances to perform the threshold value determination for the upper bit, but there is only one chance to perform the threshold value determination for the lower bit. Therefore, if the error occurrence probabilities of the above 6 cases are the same, an error in the upper bit occurs at a probability 2 times the probability that an error occurs in the lower bit.

Figure 8A:
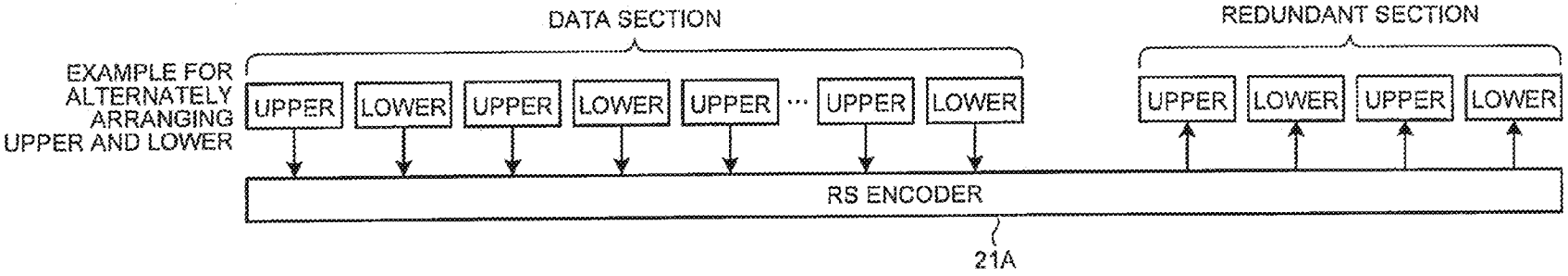
FIGS. 8A and 8B are diagrams showing a page in which encoding with RS code is performed.
Figure 8B:
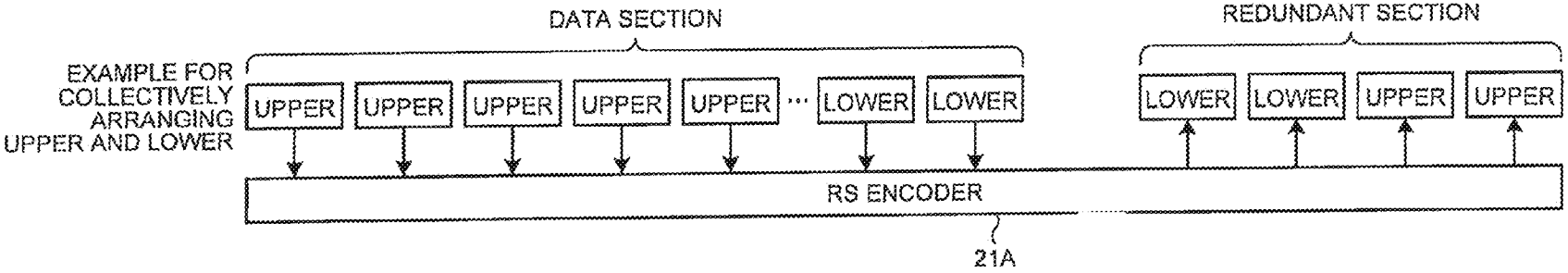

Responding to this, in this embodiment, regarding the pages where the encoding is performed by the RS encoder 21A, the number of Upper bit pages and the number of Lower bit pages are approximately the same. In this case, for example, as illustrated in FIG. 8A, it can be considered that the Upper bit pages and the Lower bit pages are alternately arranged in the data section and the redundant section. Alternatively, as illustrated in FIG. 8B, in the data section and the redundant section, the Upper bit pages may be collectively arranged and also the Lower bit pages may be collectively arranged.

Since there are the same number of Upper bit pages and the Lower bit pages in the entire flash memory section 13, if Lower bit pages having a low error probability are collectively arranged in one page of each plane, Upper bit pages having a high error probability are collectively arranged in other pages of each plane. In this case, in the pages in which the Lower bit pages are collectively arranged, the error occurrence probability is low and error correction is easy. In contrast, in the pages in which the Upper bit pages are collectively arranged, the error occurrence probability is very high, and when errors occur, the number of which exceeds an error correction capability of the RS encoder 21A, error correction is impossible. Therefore, the number of Upper bit pages and the number of Lower bit pages that are encoded by the RS encoder 21A are set to be approximately the same, and entire characteristics are averaged, so that more efficient error correction is possible.

<Decoding Processing>

Figure 9:
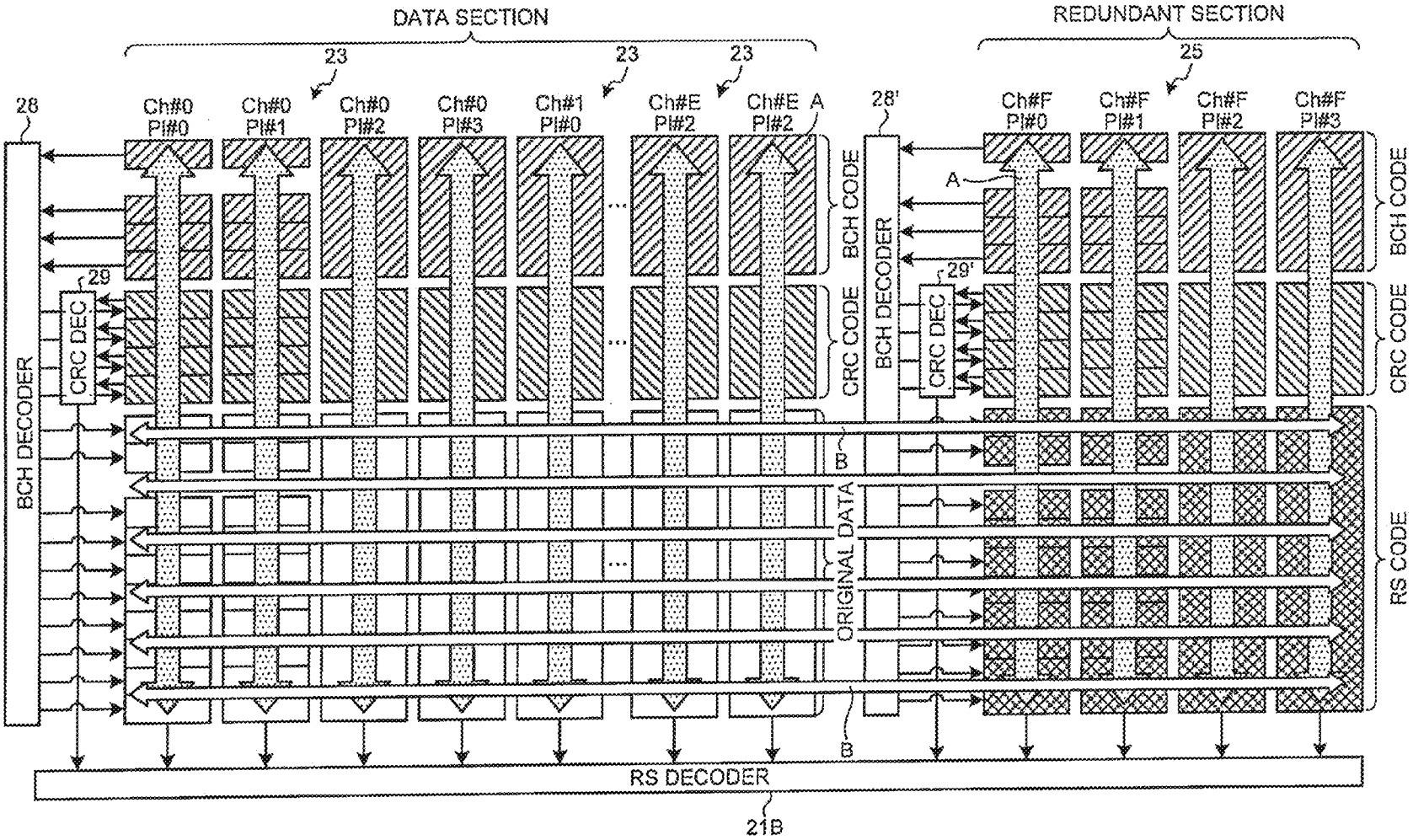
FIG. 9 is a diagram schematically showing decoding processing of error correction code according to the embodiment.

Next, decoding processing of error correction code according to the embodiment will be described. FIG. 9 schematically shows the decoding processing of error correction code according to the embodiment. In FIG. 9, an RS decoder 21B (a second error correction section) indicates a portion that realizes the decoding function of the RS E/D section 21 in FIG. 1. The BCH decoder 28' and the CRC decoder 29' are constituent elements included in the E/D section 24, and correspond to the BCH decoder 28 and the CRC decoder 29 in the E/D section 22, respectively.

In this embodiment, first, using data read from each page, as illustrated by an arrow A, the BCH code is decoded in the page direction by the BCH decoders 28 and 28', and an error check is performed on the decoding result by the CRC decoders 29 and 29' (both are represented as CRC DEC in FIG. 9) using the CRC code. As a result of the error check, if it is determined that the sum of the number of errors in the data section and the redundant section is 0, the error correction processing is completed.

Here, regarding the data in which error is detected as a result of the error check using the CRC code, in decoding processing thereafter, the data before the decoding processing using the BCH code is used. Alternatively, regarding the data in which error is detected, in decoding processing thereafter, the data on which the decoding processing using the BCH code is performed may be used.

As a result of the error check using the CRC code, if it is determined that the sum of the number of errors in the data section and the redundant section is not 0, as illustrated by an arrow B, the RS code is decoded across the pages by the RS decoder 21B. Here, as a result of the error check using the CRC code, when the sum of the number of errors is greater than 0 and smaller than or equal to a predetermined number defined by a configuration of the RS code, the RS decoder 21B decodes the RS code by using an erasure correction, and then the error correction processing is completed.

On the other hand, as a result of the error check using the CRC code, when the sum of the number of errors exceeds the predetermined number, the RS decoder 21B decodes the RS code by using normal error correction processing. By this decoding of the RS code, there is a possibility that the number of errors in the direction of the arrow A, which is the page direction, decreases and the decoding of the BCH code becomes valid. Therefore, the BCH decoders 28 and 28' and the CRC decoders 29 and 29' use the decoding result of the RS code to further decode the BCH code and perform an error check on the decoding result of the RS code by using the CRC code in accordance with the arrow A. Here, when the sum of the number of errors in the data section and the redundant section becomes 0, the error correction processing is completed.

By this decoding of the BCH code which is performed repeatedly, there is a possibility that the number of errors in the direction across the pages decreases and the decoding of the RS code becomes valid again. In accordance with a result of the error check using the CRC code, when the sum of the number of errors is greater than 0 and smaller than or equal to a predetermined number, the RS decoder 21B decodes the RS code by using the erasure correction again, and then the error correction processing is completed. Further, when the sum of the number of errors is greater than the predetermined number, but smaller than that of when the previous error check using the CRC code is performed, the decoding of the RS code, the decoding of the BCH code, and the error check using the CRC code are repeatedly performed again.

Here, data read from each page of the data section and the redundant section are sent to the RS decoder 21B. Specifically, a decoding output of the BCH code and the CRC code from a plurality of E/D sections 22 and a decoding output of the BCH code and the CRC code from the E/D sections 24 are sent to the RS decoder 21B.

More specifically, for example, data block sets constituted by the data block BCH, the data block CRC, and the data block Data read from pages corresponding to each other in planes in the NAND flash memory chips 23 are sent to the corresponding E/D sections 22, respectively. In each E/D section 22, the BCH decoder 28 decodes the BCH code included in the data block set, for example, for every 8 bits.

The output of the BCH decoder 28 is sent to the CRC decoder 29 and also sent to the RS decoder 21B. The CRC decoder 29 decodes the CRC code included in the received output of the BCH decoder 28, performs an error check, and outputs information indicating whether an error is present or not.

Similarly, a data block set including the data block BCH, the data block CRC, and the data block RS read from pages corresponding to each other in planes in the NAND flash memory chip 25 is sent to the E/D section 24. By using the received data block set, the E/D section 24 decodes the BCH code by the internal BCH decoder 28' and decodes the CRC code by the CRC decoder 29'.

As illustrated by the arrow B in FIG. 9 described above, the RS decoder 21B reads data of the data block Data decoded by each E/D section 22 and data of the data block RS decoded by the E/D section 24, for example, 8 bits by 8 bits (1 symbol) for each plane across all the planes. Then, the RS decoder 21B decodes the RS code from the read data block RS and corrects errors being correctable by the error correction capability of the RS code in the data block Data and the data block RS.

Figure 10A:
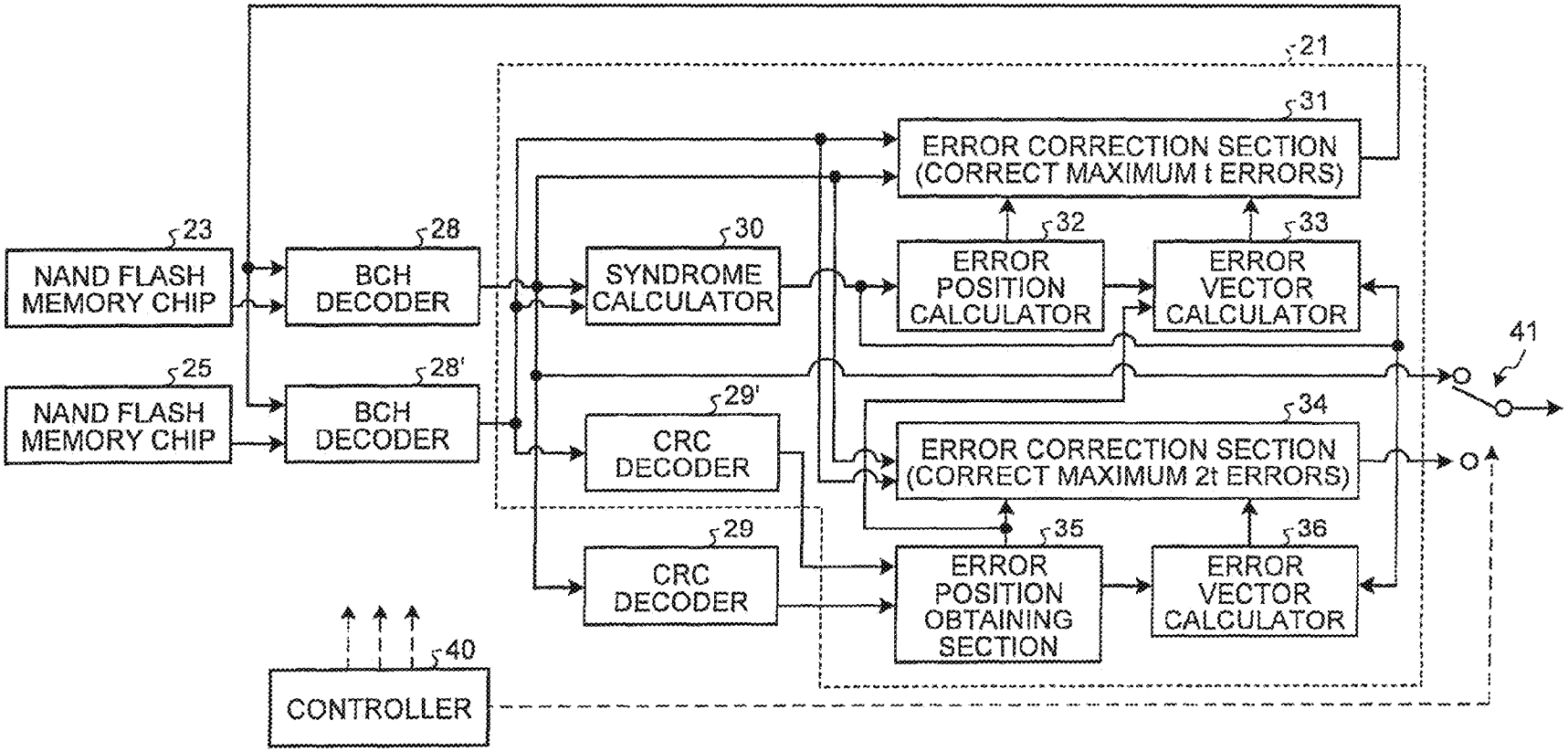
FIG. 10A is a block diagram showing a configuration of an example of an RS decoder.

The RS decoder 21B will be described in more detail. FIG. 10A shows a configuration of an example of the RS decoder 21B. The RS decoder 21B includes a syndrome calculator 30, error correction sections 31 and 34, an error position calculator 32 and an error vector calculator 33 that are connected to the error correction sections 31, and an error position obtaining section 35 and an error vector calculator 36 that are connected to the error correction sections 34. Specifically, the error correction section 31, the error position calculator 32, and the error vector calculator 33 forms a fourth error correction section. The error correction section 34, the error position obtaining section 35, and the error vector calculator 36 forms a third error correction section.

The RS decoder 21B further includes a controller 40 and a switch 41. The controller 40 includes, for example, a processor, and controls each section of the RS decoder 21B in accordance with a predetermined program. In the switch 41, one of a selection input terminal and the other selection input terminal is selected by a control of the controller 40, and data output from the RS decoder 21B is selected. The controller 40 may be a part of the function of the NAND flash controller 20.

The error correction section 31 performs error correction of up to t symbols by normal error correction of the RS code. The error correction section 34 performs error correction of up to 2t symbols by erasure correction of the RS code.

The syndrome calculator 30 calculates a syndrome of the RS code. Data is sent to the syndrome calculator 30 symbol by symbol from each data block Data that is obtained by decoding the BCH code and the CRC code and output from the BCH decoder 28. At the same time, data is sent to the syndrome calculator 30 symbol by symbol from each data block RS that is obtained by decoding the BCH code and the CRC code and output from the BCH decoder 28'.

Regarding the RS code, to correct t symbols, 2t syndromes need to be calculated. When t=2, the syndrome calculator 30 calculates 2t (=4) syndromes $S_0$, $S_1$, $S_2$, and $S_3$ from data of the data block Data and data of the data block RS by a publicly known method. A calculation method of the syndrome is described, for example, in "written by Hideki Imai, Code Theory, issued by The Institute of Electronics, Information and Communication Engineers, Jun. 1, 2001, First edition, Ninth copy". A calculation result of the syndrome is sent to the error position calculator 32 and the error vector calculator 33, and also sent to the error vector calculator 36.

In the case of normal error correction, by using the calculated syndromes $S_0$, $S_1$, $S_2$, and $S_3$, an error position and an error vector are calculated by the error position calculator 32 and the error vector calculator 33 in accordance with equation (1) below. At this time, the error vector calculator 33 calculates the error vector by further using information indicating error position obtained by the error position obtaining section 35 described below. Elements of the 4×2 matrix in the equation (1) and elements of 4×4 matrix in equation (2) described below are primitive elements of a Galois field.

$$\begin{pmatrix} S_0 \\ S_1 \\ S_2 \\ S_3 \end{pmatrix} = \begin{pmatrix} 1 & 1 \\ \alpha^i & \alpha^j \\ \alpha^{2i} & \alpha^{2j} \\ \alpha^{3i} & \alpha^{3j} \end{pmatrix} \begin{pmatrix} e_0 \\ e_1 \end{pmatrix} \tag{1}$$

In the normal error correction using the RS code, solutions of an equation with 2t unknowns including t error positions and t error vectors are obtained by using the above equation (1), and errors are corrected. In this case, four variables should be obtained, which are a variable i and a variable j that indicate error positions, and a variable $e_0$ and a variable $e_1$ that indicate error vectors. Values of the syndromes $S_0$, $S_1$, $S_2$, and $S_3$ are obtained by the syndrome calculator 30, so that the above variables can be calculated by obtaining solutions of simultaneous equations with four unknowns by the error position calculator 32 and the error vector calculator 33.

The variable i and the variable j indicating error positions and the variable $e_0$ and the variable $e_1$ indicating error vectors which are calculated by the error position calculator 32 and the error vector calculator 33 are sent to the error correction section 31. The error correction section 31 performs error correction on the data of the data block Data provided from the BCH decoder 28 and the data of the data block RS provided from the BCH decoder 28' by using the variable i, the variable j, the variable $e_0$, and the variable $e_1$. The data of the data block Data on which the error correction processing is performed is input into the BCH decoder 28 again. The data of the data block RS on which the error correction processing is performed is input into the BCH decoder 28' again.

A CRC calculation result calculated by the CRC decoder 29 and a CRC calculation result calculated by the CRC decoder 29' are sent to the error position obtaining section 35. The error position obtaining section 35 obtains information indicating error position from the provided calculation results. In the erasure correction using the RS code, if 2t error positions are known, 2t errors can be corrected. In this case, the error vector calculator 36 calculates an error vector from the syndromes $S_0$, $S_1$, $S_2$, and $S_3$ calculated by the syndrome calculator 30 and information indicating error position provided from the CRC decoder 29 in accordance with equation (2) below.

$$\begin{pmatrix} S_0 \\ S_1 \\ S_2 \\ S_3 \end{pmatrix} = \begin{pmatrix} 1 & 1 & 1 & 1 \\ \alpha^i & \alpha^j & \alpha^k & \alpha^l \\ \alpha^{2i} & \alpha^{2j} & \alpha^{2k} & \alpha^{2l} \\ \alpha^{3i} & \alpha^{3j} & \alpha^{3k} & \alpha^{3l} \end{pmatrix} \begin{pmatrix} e_0 \\ e_1 \\ e_2 \\ e_3 \end{pmatrix} \tag{2}$$

In the erasure correction using the RS code, solutions of an equation with 2t unknowns that are 2t error vectors are obtained by using the above equation (2), and errors are corrected. In this case, the variable i, the variable j, a variable k, and a variable l that indicate error positions have already been obtained by the CRC decoder 29, so that variables that should be obtained are the variable $e_0$, the variable $e_1$, a variable $e_2$, and a variable $e_3$ that indicate error vectors. Therefore, the above variables can be calculated by obtaining solutions of simultaneous equations with four unknowns by the error vector calculator 36.

The information indicating error position obtained by the error position obtaining section 35, and the variable $e_0$, the variable $e_1$, the variable $e_2$, and the variable $e_3$ indicating error vectors calculated by the error vector calculator 36 are sent to the error correction section 34. The error correction section 34 performs error correction on the data of the data block Data provided from the BCH decoder 28 by using the information indicating error position, the variable $e_0$, the variable $e_1$, the variable $e_2$, and the variable $e_3$. The data of the data block Data on which the error correction processing is performed is input into the other selection input terminal of the switch 41.

In the switch 41, one of a selection input terminal and the other selection input terminal is selected by a control of the controller 40, and the switch 41 selects which output is used as the output of the RS decoder 21B, the output of the BCH decoder 28 or the output of the error correction section 34.

Figure 11:
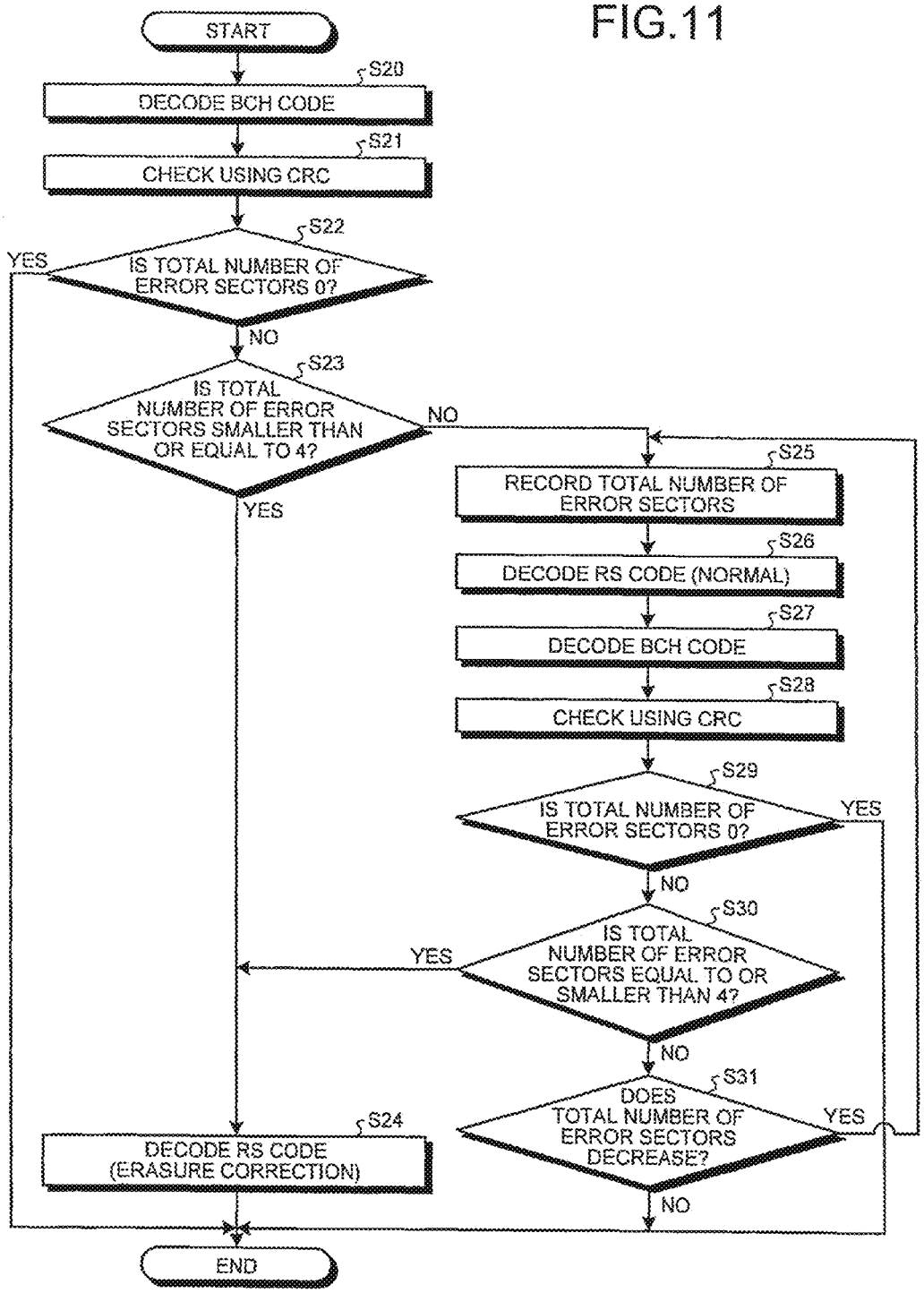
FIG. 11 is a flowchart of an example showing error correction processing according to the embodiment.

FIG. 11 is a flowchart of an example showing the error correction processing according to the embodiment. The processing illustrated in FIG. 11 is an example of a case in which the number of symbols to be corrected t=2. Each processing in the flowchart shown in FIG. 11 is performed by components controlled by the controller 40.

Before executing the flowchart shown in FIG. 11, the controller 40 reads the data block BCH, the data block CRC, and the data block Data (collectively referred to as a second data block set) from one page of each plane corresponding to each other in each NAND flash memory chip 23, and sends the second data block set to each E/D section 22 corresponding to each NAND flash memory chip 23. Each E/D section 22 stores data of the received second data block set in a memory not shown in the figures. Similarly, the controller 40 reads the data block BCH, the data block CRC, and the data block RS (collectively referred to as a first data block set) from the NAND flash memory chip 25, and sends the first data block set to the E/D section 24. The E/D section 24 stores data of the received first data block set in a memory not shown in the figures.

In step S20, the BCH decoder 28 decodes the BCH code included in the data block BCH in the second data block set. Based on this, the BCH decoders 28 perform error correction processing, which corrects errors that is correctable by the error correction capability of the BCH code, on the data block CRC and the data block Data included in the second data block set. Similarly, the BCH decoder 28' decodes the BCH code included in the data block BCH in the first data block set. Based on this, the BCH decoder 28' performs error correction processing, which corrects errors that is correctable by the error correction capability of the BCH code, on the data block CRC and the data block RS included in the first data block set.

In the next step S21, the CRC decoder 29 decodes the CRC code included in the data block CRC on which the error correction processing using the BCH code is performed, and performs an error check. Similarly, the CRC decoder 29' decodes the CRC code included in the data block CRC on which the error correction processing using the BCH code is performed, and performs an error check. By this error check, the number of error sectors and positions (pages) thereof in the first data block set that were not corrected by the error correction using the BCH code in step S20, and the number of error sectors and positions thereof in the first data block set are obtained. The sector is, for example, a minimum recording unit of the NAND flash memory chip 23, and corresponds to one data block Data.

The syndrome calculator 30 calculates 2t syndromes by using one symbol of the data of each data block Data whose errors are corrected by each BCH decoder 28 in step S20 and one symbol of the data of the data block RS whose errors are corrected by the BCH decoder 28' across the planes.

The process returns to the flowchart in FIG. 11, and in step S22, the controller 40 determines whether or not the total number of error sectors that is the sum of the number of error sectors in the second data block set and the number of error sectors in the first data block set is 0. If it is determined that the total number of error sectors is 0, the series of processing in the flowchart of FIG. 11 ends. In this case, one of the selection input terminals of the switch 41 is selected by the controller 40, and data of the data block Data which is output from the BCH decoder 28 and includes data on which the error correction processing is performed is determined to be an output of the RS decoder 21B.

On the other hand, in step S22, if the controller 40 determines that the total number of error sectors is not 0, the controller 40 moves the process to step S23, and determines whether or not the total number of error sectors is smaller than or equal to 4 (=2t). If it is determined that the total number of error sectors is greater than 4, the process moves to step S25.

On the other hand, if it is determined that the total number of error sectors is smaller than or equal to 4, the process moves to step S24. In step S24, the erasure correction is performed by the RS decoder 21B.

Specifically, in the RS decoder 21B, the error position obtaining section 35 obtains information indicating error position by page from the error check results of the CRC decoder 29 and the CRC decoder 29' in step S21. The error vector calculator 36 performs calculation of the above described equation (2) using the information indicating error position that is obtained by the error position obtaining section 35 and 2t syndromes calculated on the basis of a piece of data selected from the data block Data and a piece of data selected from the data block RS in the syndrome calculator 30 so as to calculate error vectors respectively corresponding to the pieces of selected data. In this case, according to the determination in step S23, the total number of error sectors, in other words, the number of pages containing error is smaller than or equal to 2t, so that solutions of the equation (2) can be obtained.

The error correction section 34 performs error correction on the data of the data block Data provided from the BCH decoder 28 and the data of the data block RS provided from the BCH decoder 28' by using the information indicating error position obtained by the error position obtaining section 35 and the error vectors calculated by the error vector calculator 36. In addition, the error correction section 34 restores the CRC code by recalculating the CRC code on the basis of the data whose error is corrected in step S24.

Further, the other selection input terminal of the switch 41 is selected by control of the controller 40, and data of the data block Data which is output from the error correction section 34 and includes data whose error is corrected is determined to be an output of the RS decoder 21B.

If it is determined that the total number of error sectors is greater than 4 in step S23, the process moves to step S25 and the total number of error sectors is stored, for example, in a register or the like included in the controller 40.

In the next step S26, normal error correction processing is performed by the RS decoder 21B. Specifically, in the RS decoder 21B, the error position calculator 32 and the error vector calculator 33 perform calculation of the above described equation (1) using 4 syndromes calculated on the basis of a piece of data selected from the data block Data and a piece of data selected from the data block RS in the syndrome calculator 30 to calculate error positions and error vectors respectively corresponding to the pieces of selected data.

The information indicating the error positions and the information indicating the error vectors are sent to the error correction section 31. The error correction section 31 performs error correction on the data of the data block Data provided from the BCH decoder 28 and the data of the data block RS provided from the BCH decoder 28' by using the error positions and the error vectors.

Figure 12:
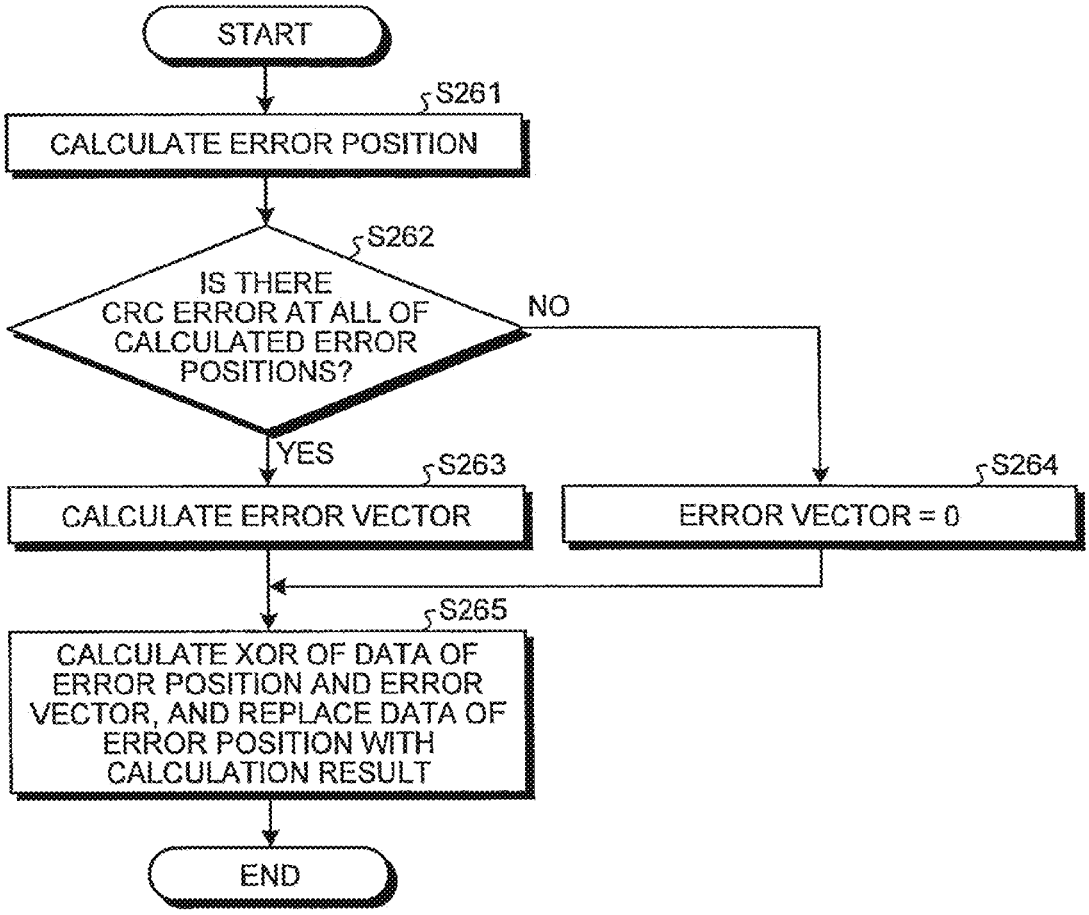
FIG. 12 is a flowchart of an example showing normal error correction processing by the RS decoder.

FIG. 12 is a flowchart showing in more detail an example of normal decoding processing using the RS code in step S26. In step S261, the error position calculator 32 calculates error positions by using the 4 syndromes calculated by the syndrome calculator 30. In the next step S262, the error vector calculator 33 refers to the result of error check using the CRC code obtained in step S21 described above and determines whether or not there is an error, which is a CRC error, at all the error positions calculated in step S261.

If it is determined that there is a CRC error at all the error positions in step S262, the process moves to step S263, and the error vector calculator 33 calculates error vectors by using the 4 syndromes calculated by the syndrome calculator 30.

On the other hand, if it is determined that there is no CRC error in at least one error position, the process moves to step S264, and the error vector is set to 0. Specifically, if the error positions respectively corresponding to the pieces of selected data are not any of the positions of error sectors calculated in step S21, all the error vectors respectively corresponding to the pieces of selected data are set to 0, and error correction processing is not actually performed. The processing is not limited to the above, and the error correction section 31 may not perform error correction on the selected data. In this way, it is possible to prevent a so-called miscorrection in which error correction processing is erroneously performed on a data position where no error occurs, and errors are further increased.

Figure 10B:
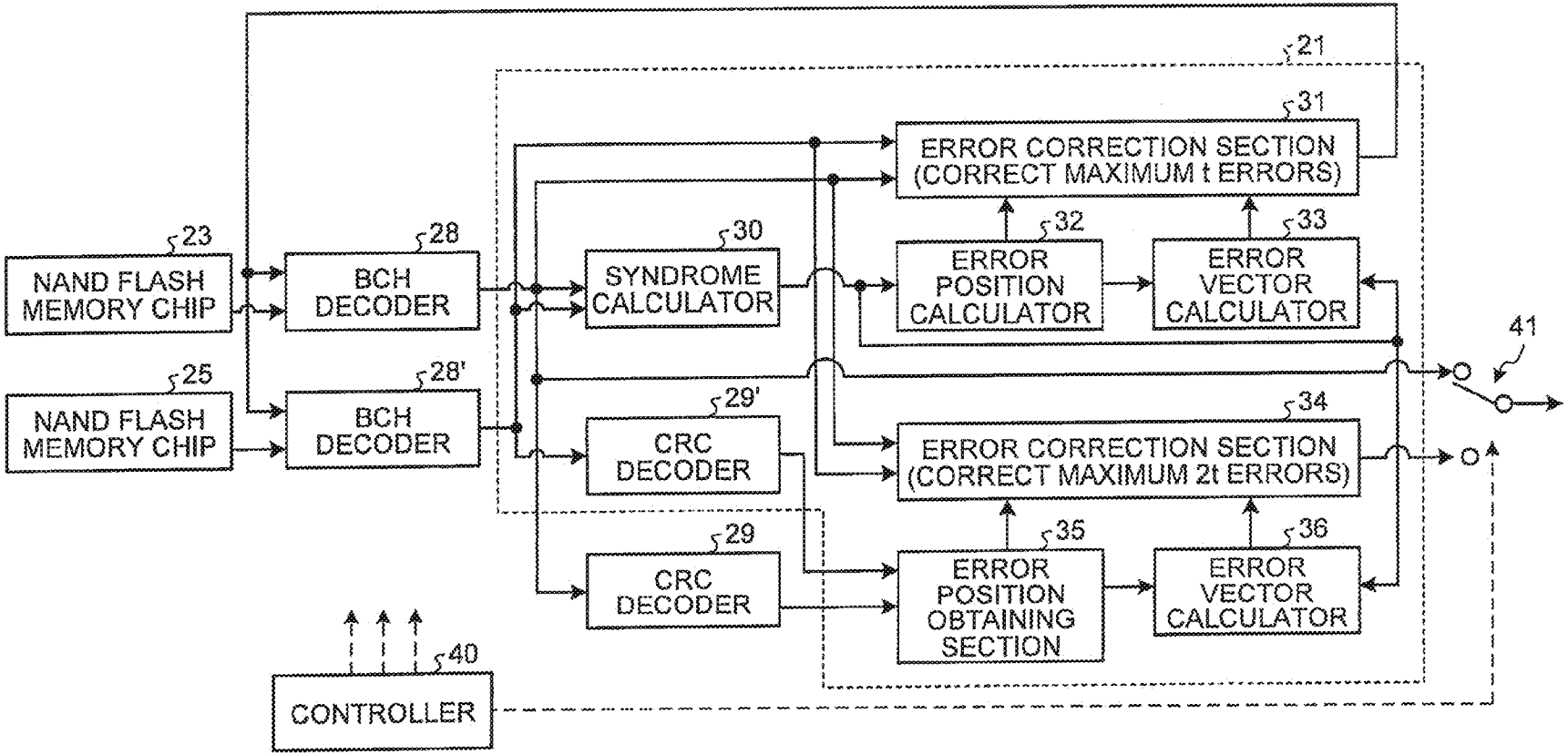
FIG. 10B is a block diagram showing a configuration of another example of the RS decoder.

Here, it is possible not to prevent the miscorrection. In this case, the processing of step S264 can be omitted. For example, the process moves directly from step S261 to step S263. Also in this case, as illustrated in FIG. 10B, a path for providing error position information from the error position obtaining section 35 to the error vector calculator 33 in FIG. 10A can be omitted. The error position obtaining section 35 does not send the error position information to the error vector calculator 33, and the error vector calculator 33 does not receive the error position information from the error position obtaining section 35.

When the error vector calculator 33 obtains error vectors in step S263 or step S264, the process moves to step S265, and the error vector calculator 33 calculates an XOR of the information indicating error position (error position data) and error vector, and replaces the error position data with the calculation result. Then, the process moves to step S27 in FIG. 11.

When the normal error correction of the RS decoder 21B is performed in step S26, the process proceeds to step S27. In step S27, the BCH code is decoded again using the error correction result of step S26 by the BCH decoder 28 and the BCH decoder 28'.

Specifically, in step S27, data of the data block Data including data on which the error correction processing is performed in step S26 is input into the BCH decoder 28. The BCH decoders 28 decodes the BCH code in the data provided from the error correction section 31 by using data of the data block BCH included in the second data block set stored, for example, in a memory not shown in the figures in the E/D section 22, and corrects errors that is correctable by the error correction capability of the BCH code.

Specifically, data of the data block RS including data on which the error correction processing is performed in step S26 is input into the BCH decoder 28'. The BCH decoders 28' decodes the BCH code in the data provided from the error correction section 31 by using data of the data block BCH included in the first data block set stored, for example, in a memory not shown in the figures in the E/D section 24, and corrects errors that is correctable by the error correction capability of the BCH code.

Here, in step S26, error correction is performed by a method different from the error correction using the BCH code in step S20 described above. In an example according this embodiment, as described above, in step S26, the error correction is performed using the RS code across the pages by the RS decoder 21B. Therefore, the number of errors decreases in the data block Data, so that even after the error correction using the BCH code in step S20, error correction using the same BCH code may be effective.

When the BCH code is decoded in step S27, the process moves to step S28. In a similar manner as in step S22 described above, in step S28, the CRC decoder 29 and the CRC decoder 29' respectively decode the CRC code included in each data block CRC of the second data block set and the first data block set on which the error correction processing is performed in step S20. Based on this, an error check is respectively performed on the data block Data and the data block RS on which the error correction processing is performed in step S27. The number of error sectors obtained as a result of the error check on the data block Data and the number of error sectors obtained as a result of the error check on the data block RS are added together to obtain the total number of error sectors.

In the next step S29, the controller 40 determines whether or not the total number of error sectors is 0 from the error check result in step S28. If it is determined that the total number of error sectors is 0, the series of processing in FIG. 11 ends. Then, one of the selection input terminals of the switch 41 is selected by the controller 40, and data of the data block Data which is output from the BCH decoder 28 and includes data on which the error correction processing is performed is determined to be data whose errors are successfully corrected and output from the RS decoder 21B.

On the other hand, in step S29, if it is determined that the total number of error sectors is not 0, the process moves to step S30, and it is determined whether or not the total number of error sectors is smaller than or equal to 4 (=2t). If it is determined that the total number of error sectors is smaller than or equal to 4, the process moves to step S24, the RS decoder 21B performs erasure correction on data of the data block Data which is output from the BCH decoder 28 and includes data on which error correction processing is performed. Then, the other selection input terminal of the switch 41 is selected by control of the controller 40, and data of the data block Data which is output from the error correction section 34 and includes data whose error is corrected is determined to be data whose errors are successfully corrected and output from the RS decoder 21B.

On the other hand, in step S30, if it is determined that the total number of error sectors is greater than 4, the process moves to step S31. In step S31, the controller 40 determines whether or not the current total number of error sectors has decreased from the number of error sectors stored in step S25. If it is determined that the current total number of error sectors has decreased, the process returns to step S25, the number of error sectors is stored in a register or the like in the controller 40, and the processing of step S26 and following steps is repeatedly performed.

On the other hand, in step S31, if it is determined that the total number of error sectors has not decreased, the series of processing in the flowchart of FIG. 11 ends. In this case, it is indicated that there are errors that have not been corrected, so that, for example, a message indicating an error is output.

The error correction method according to this embodiment will be examined with reference to FIGS. 13 to 17 and the flowchart of FIG. 11 described above. Hereinafter, it is assumed that two symbols can be corrected by the BCH code, and one symbol can be corrected by the RS code when t=1, that is, normal error correction, and two symbols can be corrected by the RS code when using the erasure correction. Based on this, in the flowchart of FIG. 11, "Is the total number of error sectors smaller than or equal to 4?" in step S23 and step S30 is replaced by "Is the total number of error sectors smaller than or equal to 2?".

In FIGS. 13 to 17, each cell represents data of one symbol. The horizontal direction is the page direction, and two columns including the 0th and the first columns at the left edge represent the BCH code. The vertical direction is the direction across the pages, and two rows including the sixth and the seventh rows at the bottom edge except for the 0th and the first columns represent the RS code. The portion enclosed by the BCH code and the RS code represents the original data. Specifically, in each row (each page), the BCH code of the leftmost 2 symbols is generated with respect to the original data and the RS code in the row. Similarly, in each column, the RS code of the lowermost 2 symbols is generated with respect to the original data in the column. In each row, the portion except for the BCH code corresponds to a sector.

Figure 13:
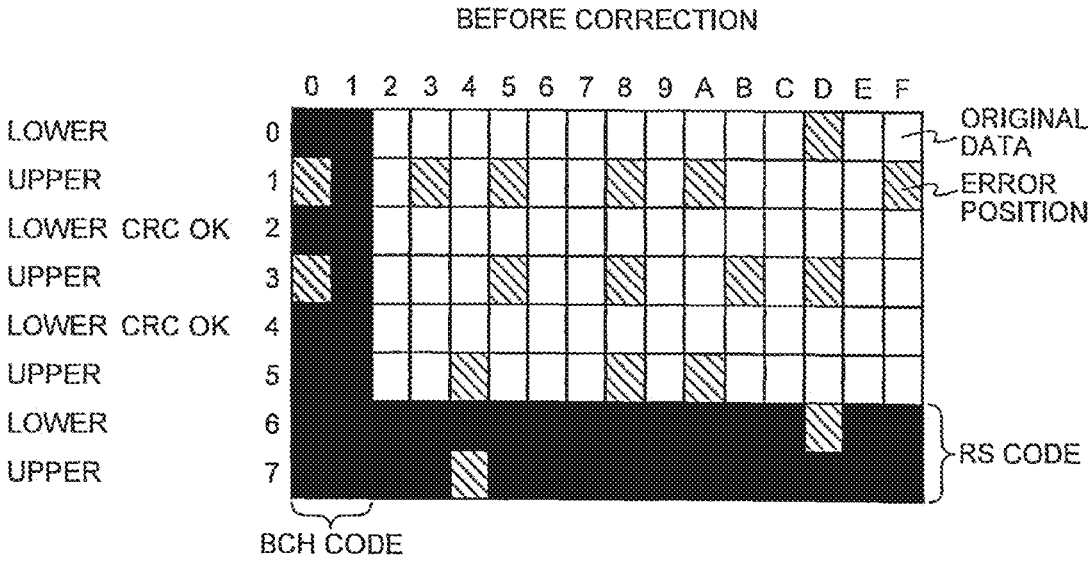
FIG. 13 is a diagram for validating an error correction method according to the embodiment.

Further, "CRC OK" represents a row (sector) in which no error is detected as a result of decoding the CRC code. The symbols containing error is represented by a cell marked with diagonal lines. FIG. 13 shows data before performing error correction processing, and an error occurs in one symbol in the 0th row, six symbols in the first row, five symbols in the third row, three symbols in the fifth row, one symbol in the sixth row, and one symbol in the seventh row.

"Upper" and "Lower" respectively represent the Upper bit page and the Lower bit page described using FIGS. 8A and 8B. As described above, it is considered that the Upper bit page has higher error occurrence probability compared with the Lower bit page.

Figure 14:
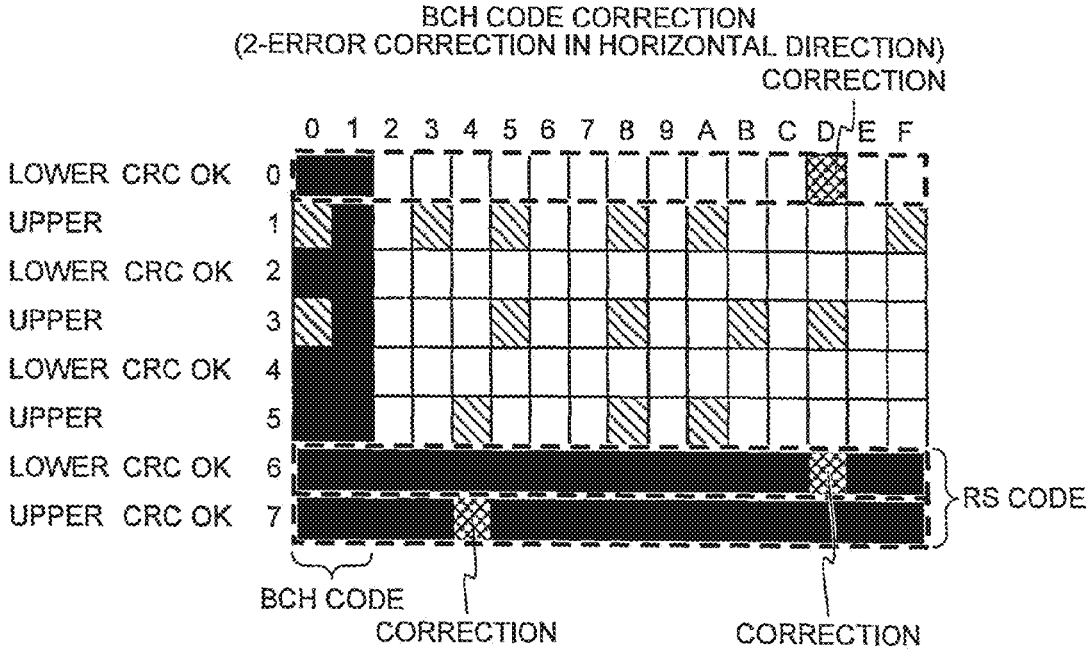
FIG. 14 is a diagram for validating the error correction method according to the embodiment.

In the flowchart of FIG. 11, it is possible to correct 2 symbols containing an error in the error correction by decoding of the BCH code in step S20, so that, as illustrated in FIG. 14, errors are corrected in the 0th row, the sixth row, and the seventh row that include two or less symbols containing an error. A cell representing a symbol whose error will be corrected is marked with crossed diagonal lines. The result of the error correction is reflected in the error check using the CRC code in step S21, and it is shown that the total number of error sectors is 3 because there are 3 rows in which the original data contains error, which are the first row, the third row, and the fifth row.

Figure 15:
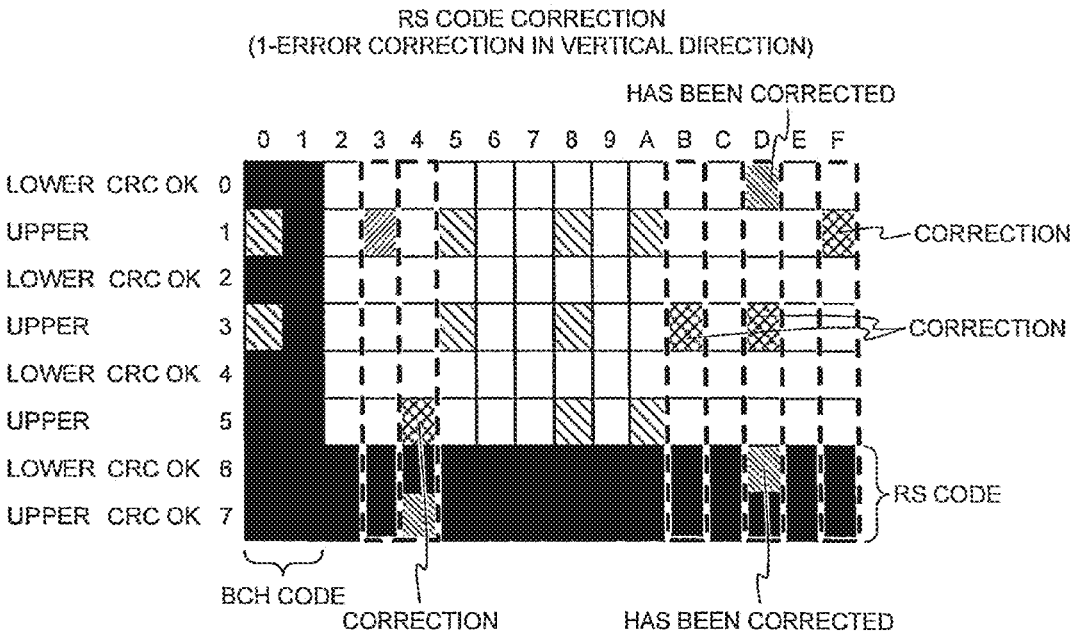
FIG. 15 is a diagram for validating the error correction method according to the embodiment.

Since the total number of error sectors is 3, by the determination in step S22, the process moves to step S23. Since the total number of error sectors is not smaller than or equal to 2, by the determination in step S23, the process moves to step S25, and "the total number of error sectors=3" is stored. In the next step S26, it is possible to correct 1 symbol containing an error in the normal error correction by the RS decoder 21B, so that, as illustrated in FIG. 15, an error is corrected in the third column, the fourth column, the 11th (Bth) column, the 13th (Dth) column, and the 15th (Fth) column. Among them, although there were two or more symbols containing an error in the fourth column and the 13th column before the error correction, there is only one symbol containing an error in the fourth column and the 13th column as a result of the error correction using the BCH code in step S20, so that it is possible to perform the normal error correction using the RS code. A cell representing a symbol whose error has been corrected is marked with dense diagonal lines.

Figure 16:
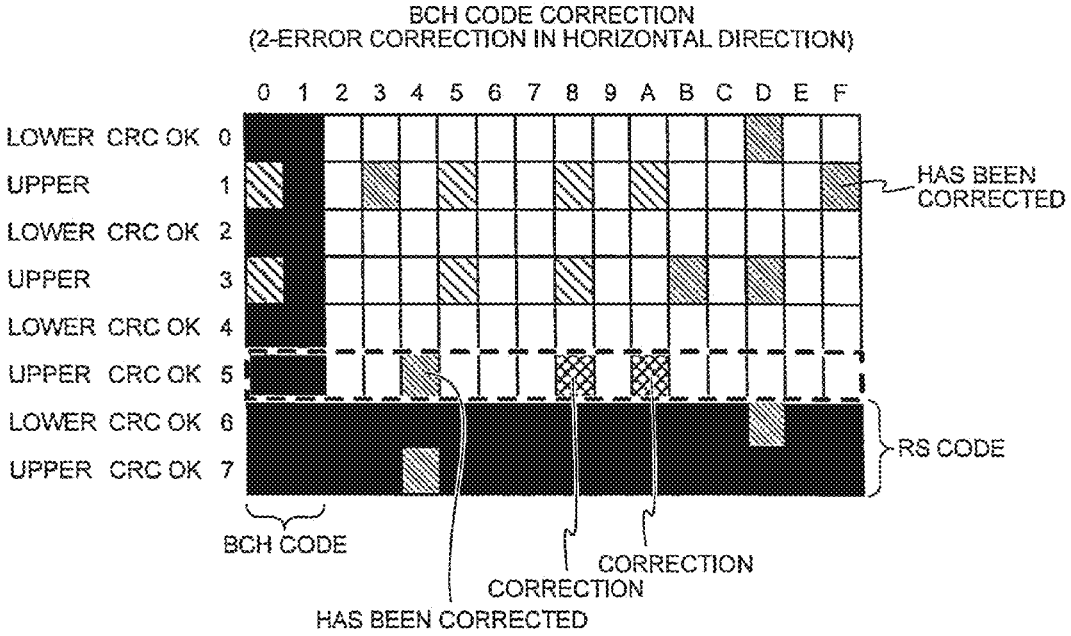
FIG. 16 is a diagram for validating the error correction method according to the embodiment.

Next, in step S27, the error correction using the BCH code is performed again. As illustrated in FIG. 16, errors are corrected in the fifth row which includes two or less symbols containing an error. In the fifth row, there were more than 2 symbols containing an error before the error correction, and thus errors could not be corrected by the error correction using the BCH code in step S20. In step S26, the number of symbols containing an error decreases by 1 to 2 by the error correction using the RS code, so that it is possible to perform the error correction using the BCH code.

Although, in the third row, the number of symbols containing an error in the original data is 2, the error correction using the BCH code is not performed because there is an error in the BCH code itself.

Figure 17:
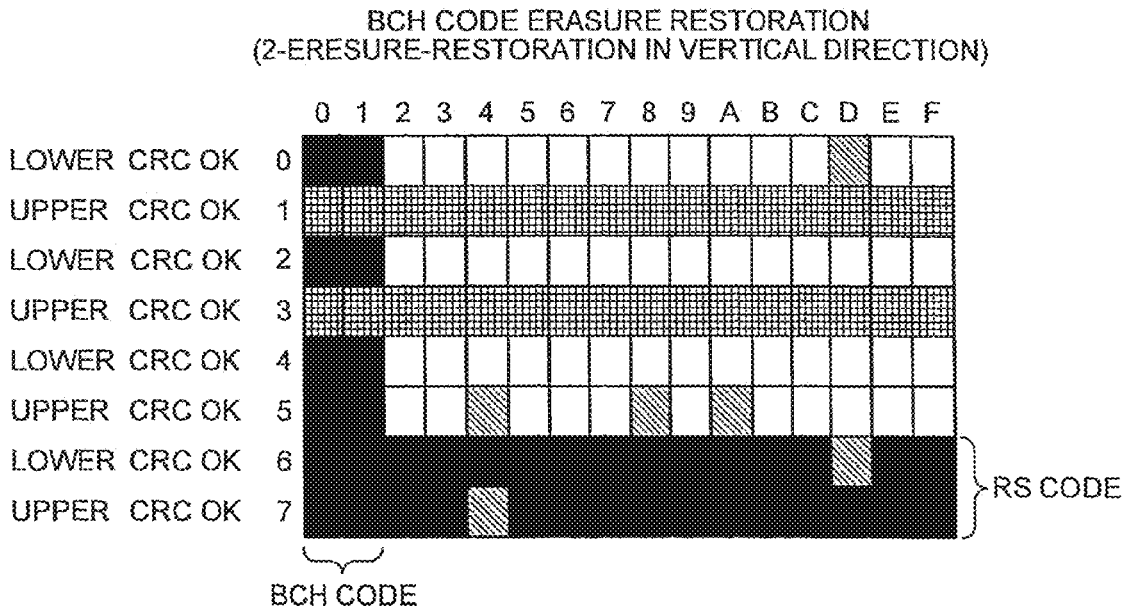
FIG. 17 is a diagram for validating the error correction method according to the embodiment.

The result of the error correction in step S27 is reflected in the error check using the CRC code in step S28, and it is shown that the total number of error sectors is 2 because there are 2 rows in which the original data contains error, which are the first row and the third row. Therefore, it is determined that the total number of error sectors is not 0 in step S29, the process moves to step S30, and it is determined that the total number of error sectors is smaller than or equal to 2 in step S30. Since the RS decoder 21B can correct up to 2 symbols containing an error for each column by the erasure correction, the process moves to step S24, and as illustrated in FIG. 17, the RS decoder 21B corrects remaining symbols containing an error by the erasure correction to restore the original data.

In the state of FIG. 14 described above, 3 rows of the first row, the third row, and the fifth row respectively include three or more symbols containing an error in the row direction, and in the first row and the third row, the BCH code itself has an error, so that the error correction using the BCH code cannot be performed as they are. In addition, the eighth column has three symbols containing an error in the column direction, so that the error correction using the RS code cannot be performed. As described above, error correction cannot be performed on the first row, the third row, and the fifth row by the above described error correction capability of the BCH code and the RS code in conventional methods.

On the other hand, in the embodiment, after the first error correction in a page using the BCH code is performed, the error correction method using the RS code in which error correction is performed across the planes, that is, across the NAND flash memory chip is selected. When the normal error correction using the RS code is selected, the error correction using the BCH code is performed, and thereafter, further the error correction using the RS code and the error correction using the BCH code are repeatedly performed in accordance with the total number of error sectors, so that even in the cases of the first row, third row, and the fifth row described above, errors can be corrected.

The RS code generated with respect to the original data is recorded in a NAND flash memory chip different from the NAND flash memory chip of the original data. Based on this, tolerability of burst failure and random error correction capability necessary for long term data saving can be improved in parallel.

Furthermore, processing is switched in accordance with the number of sectors containing an error, so that error correction speed in the normal operation can be improved, and also the power consumption can be reduced.

According to the embodiment, the redundant code used for the error correction code for obtaining error correction capability of burst error occurring in NAND flash memories is also used as a redundant code used for the error correction code for correcting random errors. Therefore, the random error correction capability can be improved without adding an area in which error correction codes necessary for improving the random error correction capability are recorded to the area in which error correction codes necessary for improving the burst error correction capability are recorded.

According to the embodiment, when reproducing recorded data, first, error correction is performed on a first data by a first error correction means, and error correction using a third error correction means is applied to a second error correction code. Next, a first error check code is applied to the first data, a second error check code is applied to a fourth data, and error check is performed on the first data and the fourth data respectively. When the total number of errors in the first data and the first error check code is within an error erasure correction capability of the second error correction code, a burst error is corrected by performing the error erasure correction on the first data and the second error correction code. On the other hand, when the total number of errors in the first data and the first error check code exceeds the error erasure correction capability of the second error correction code, random errors are corrected by using an error correction method that obtains an error position and an error vector by the Reed-Solomon code on a portion including positions corresponding to the second data and the second error correction code.

According to the embodiment, the series of error correction processing described above is repeatedly performed until all the errors are corrected by an error check means, or until the number of errors corrected by the series of error correction processing does not increase.

Further, according to the embodiment, in the series of error correction processing described above, in the processing for correcting random errors by using the Reed-Solomon code, miscorrection is prevented by not performing error correction on a portion that is not detected by the first check code or the second check code.

According to the invention, in a semiconductor memory device including a large number of memory chips, there is an effect that it is possible to obtain a capability to restore burst data failure and improve the correction capability of errors that occur randomly.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the foim of the embodiments described herein may be made without departing from the spirit of the inventions. The accompanying claims and their equivalents are intended to cover such forms or modifications as would fall within the scope and spirit of the inventions.

What is claimed is:

[1. A semiconductor memory device comprising:

a memory chip;

a first encoder/decoder (E/D) configured to obtain a first error check code and a first error correction code based on an original data, the original data, the first error check code, and the first error correction code are recorded on a first page of a memory chip;

an encoder configured to obtain a second error correction code for the original data, the type of the second error correction is different from the type of the first error correction; and a second E/D configured to obtain a second error check code and a third error correction code based on the second error correction code wherein, the second error correction code, the second error check code, and the third error correction code are recorded on a second page of a memory chip.]

[2. The device of claim 1, wherein the first E/D obtains the first error check code based on the original data and obtains the first error correction code based on the original data and the first error check code, and the second E/D obtains the second error check code based on the second error correction code and obtains the third error correction code based on the second error correction code and the second error check code.]

[3. The device of claim 2, wherein a size of a data block of the original data and a size of a data block of the second error correction code are the same.]

[4. The device of claim 3, wherein the second error correction code is formed across a plurality of pages in a direction crossing data blocks of the original data.]

[5. The device of claim 1, wherein the data block of the second error correction code is recorded in a page having an error-expected value smaller than an average value of error-expected values of pages in a memory chip.]

*6. A storage device comprising:*

*memory chips including a first memory chip, and a second memory chip, each of the first memory chip and the second memory chip having a plurality of blocks and each block including a plurality of pages;*

*a first encoder which obtains a first error check code and a first error correction code based on an original data, wherein the original data, the first error check code, and the first error correction code are recorded in the first memory chip;*

*a second encoder which obtains a second error correction code for the original data, wherein the type of the second error correction is different from the type of the first error correction;*

*a third encoder which obtains a second error check code and a third error correction code based on the second error correction code, wherein the second error correction code, the second error check code, and the third error correction code are recorded in the second memory chip;*

*a first decoder which decodes the first error correction code recorded in the first memory chip;*

*a second decoder which decodes the third error correction code recorded in the second memory chip;*

*a third decoder which performs a first error check of the decoded first error correction code, by using the first error check code;*

*a fourth decoder which performs a second error check of the decoded third error correction code, by using the second error check code; and*

*a fifth decoder which decodes the second error correction code of the first memory chip and the second memory chip, based on a first result of a first sum of error number obtained from the first error check and the second error check,*

*wherein*

*if the first result of the first sum is 0, then an error correction processing is completed, and*

*if the first result of the first sum is not 0, then the fifth decoder decodes the second error correction code across the pages of the first and second memory chips and the error correction processing is performed.*

*7. The storage device according to claim 6, wherein*

*when the first sum of error number is greater than 0 and the smaller than or equal to a predetermined number, the fifth decoder decodes the second error correction code by using an erasure correction to complete the error correction processing.*

*8. The storage device according to claim 6, wherein*

*when the first sum of error number exceeds a predetermined number, the fifth decoder decodes the second error correction code by using a normal error correction processing.*

*9. The storage device according to claim 8, wherein*

*the first decoder decodes a fourth error correction code and the second decoder decodes a fifth error correction code, the fourth error correction code and the fifth error correction code being latest error codes obtained after the fifth decoder decodes the second error correction code by using normal error correction processing.*

*10. The storage device according to claim 9, wherein*

*the third decoder performs a third error check of the fourth correction code and the fourth decoder performs a fourth error check of the fourth correction code.*

*11. The storage device according to claim 10, wherein the fifth decoder decodes the fourth error correction code and the fifth error correction code, based on a second result of a second sum of error number obtained from the third error check by the third decoder and the fourth error check by the fourth decoder.*

*12. The storage device according to claim 11, wherein*

*if the second result of the second sum is 0, then an error correction processing is completed, and*

*is the second result of the second sum is not 0, then the fifth decoder decodes the second error correction code across the pages of the first memory chip and the second memory chip and then the error correction processing is performed.*

*13. The storage device according to claim 12, wherein*

*if the second result of the second sum is greater than 0 and smaller than or equal to the predetermined number, the fifth decoder decodes the second error correction code by using an erasure correction to complete the error correction processing.*

*14. The storage device according to claim 6, wherein the second error correction code is obtained by extracting a symbol corresponding to the original data in the first memory chip and the second memory chip.*

*15. The storage device according to claim 6, wherein the decoding the first error correction codes and the decoding the second error correction codes are repeatedly performed.*

*16. The storage device according to claim 6, wherein*

*the second error correction code, the second error check code, and the third error correction code are recorded on a second page of the second memory chip, and*

*the second page has an error-expected value smaller than an average value of error-expected values of the plurality of pages in the first memory chip.*

*17. The storage device according to claim 6, wherein*

*the storage device further includes an interface connectable to a host.*

*18. The storage device according to claim 6, wherein*

*a first direction of the decoding the first error correction code and a second direction of the decoding the second error correction code are crossing.*

*19. The storage device according to claim 7, wherein*

*the first encoder obtains the first error check code of Cyclic Redundancy Check (CRC) code and the first error correction code of a systematic code,*

*the second encoder obtains the second error correction code of Reed-Solomon (RS) code, and*

*the third encoder obtains the second error check code of Cyclic Redundancy Check (CRC) code and the third error correction code of a systematic code.*

*20. The storage device according to claim 19, wherein*

*the systematic code is Bose-Chaudhuri-Hocquenghem (BCH) code.*

* * * * *